(12) United States Patent
More et al.

(10) Patent No.: US 10,043,665 B2
(45) Date of Patent: Aug. 7, 2018

(54) FORMATION METHOD OF SEMICONDUCTOR DEVICE STRUCTURE WITH SEMICONDUCTOR NANOWIRE

(71) Applicant: Taiwan Semiconductor Manufacturing Co., Ltd., Hsinchu (TW)

(72) Inventors: Shahaji B. More, Hsinchu (TW); Zheng-Yang Pan, Zhubei (TW); Cheng-Han Lee, New Taipei (TW); Shih-Chieh Chang, Taipei (TW); Chandrashekhar Prakash Savant, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/399,143

(22) Filed: Jan. 5, 2017

(65) Prior Publication Data

US 2018/0151357 A1 May 31, 2018

Related U.S. Application Data

(60) Provisional application No. 62/427,045, filed on Nov. 28, 2016.

(51) Int. Cl.
| | |
|---|---|
| *H01L 29/06* | (2006.01) |
| *H01L 21/02* | (2006.01) |
| *H01L 21/8238* | (2006.01) |
| *H01L 27/092* | (2006.01) |
| *H01L 29/41* | (2006.01) |
| *H01L 29/786* | (2006.01) |

(Continued)

(52) U.S. Cl.
CPC .. *H01L 21/02603* (2013.01); *H01L 21/02524* (2013.01); *H01L 21/02639* (2013.01); *H01L 21/02653* (2013.01); *H01L 21/8238* (2013.01); *H01L 27/092* (2013.01); *H01L 29/1037* (2013.01); *H01L 29/1054* (2013.01); *H01L 29/413* (2013.01); *H01L 29/66742* (2013.01); *H01L 29/78696* (2013.01); *H01L 21/02529* (2013.01); *H01L 21/02532* (2013.01)

(58) Field of Classification Search
CPC .................................................. H01L 29/0669
See application file for complete search history.

(56) References Cited

U.S. PATENT DOCUMENTS

| | | |
|---|---|---|
| 7,667,271 B2 | 2/2010 | Yu et al. |
| 7,910,453 B2 | 3/2011 | Xu et al. |

(Continued)

*Primary Examiner* — Thao P Le
(74) *Attorney, Agent, or Firm* — Birch, Stewart, Kolasch & Birch, LLP

(57) ABSTRACT

Structures and formation methods of a semiconductor device structure are provided. The semiconductor device structure includes a substrate, a first source portion and a first drain portion over the substrate, and a first semiconductor nanowire over the substrate and between the first source portion and the first drain portion. The first semiconductor nanowire includes a first portion over the substrate and a second portion over the first portion, and the first portion has a first width, and the second portion has a second width, and the second width is less than the first width. The semiconductor device structure also includes a first gate structure over the second portion of the first semiconductor nanowire.

20 Claims, 19 Drawing Sheets

(51) Int. Cl.
    *H01L 29/10*          (2006.01)
    *H01L 29/66*          (2006.01)

(56) References Cited

U.S. PATENT DOCUMENTS

| | | |
|---|---|---|
| 8,377,779 B1 | 2/2013 | Wang |
| 8,399,931 B2 | 3/2013 | Liaw et al. |
| 8,652,894 B2 | 2/2014 | Lin et al. |
| 8,686,516 B2 | 4/2014 | Chen et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 8,900,951 B1 * | 12/2014 | Cheng ............... H01L 29/0673 257/E21.453 |
| 9,105,490 B2 | 8/2015 | Wang et al. |
| 2011/0133162 A1 * | 6/2011 | Bangsaruntip ......... B82Y 10/00 257/24 |
| 2013/0026451 A1 * | 1/2013 | Bangsaruntip .... H01L 29/66439 257/24 |
| 2014/0001574 A1 | 1/2014 | Chen et al. |
| 2014/0110755 A1 | 4/2014 | Colinge |
| 2014/0151812 A1 * | 6/2014 | Liaw ................. H01L 21/76895 257/368 |
| 2017/0077226 A1 * | 3/2017 | Oh .................... H01L 21/02425 |
| 2017/0207314 A1 * | 7/2017 | Chen ................. H01L 29/42392 |
| 2017/0301541 A1 * | 10/2017 | Kim ................. H01L 21/02639 |

\* cited by examiner

FORMATION METHOD OF SEMICONDUCTOR DEVICE STRUCTURE WITH SEMICONDUCTOR NANOWIRE

CROSS REFERENCE TO RELATED APPLICATIONS

This application claims the benefit of U.S. Provisional Application No. 62/427,045, filed on Nov. 28, 2016, and the entirety of which is incorporated by reference herein.

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature size (i.e., the smallest component that can be created using a fabrication process) has decreased. The scaling-down process generally provides benefits by increasing production efficiency and lowering associated costs.

Despite groundbreaking advances in materials and fabrication, scaling planar devices such as the metal-oxide-semiconductor field effect transistor (MOSFET) device has proven challenging. To overcome these challenges, circuit designers look to novel structures to deliver improved performance, which has resulted in the development of three-dimensional designs, such as fin-like field effect transistors (FinFETs). The FinFET is fabricated with a thin vertical "fin" (or fin structure) extending up from a substrate. The channel of the FinFET is formed in this vertical fin. A gate is provided over the fin to allow the gate to control the channel from multiple sides. Advantages of the FinFET may include a reduction of the short channel effect, reduced leakage, and higher current flow.

However, since feature sizes continue to decrease, fabrication processes continue to become more difficult to perform. Therefore, it is a challenge to form a reliable semiconductor device including the FinFET.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
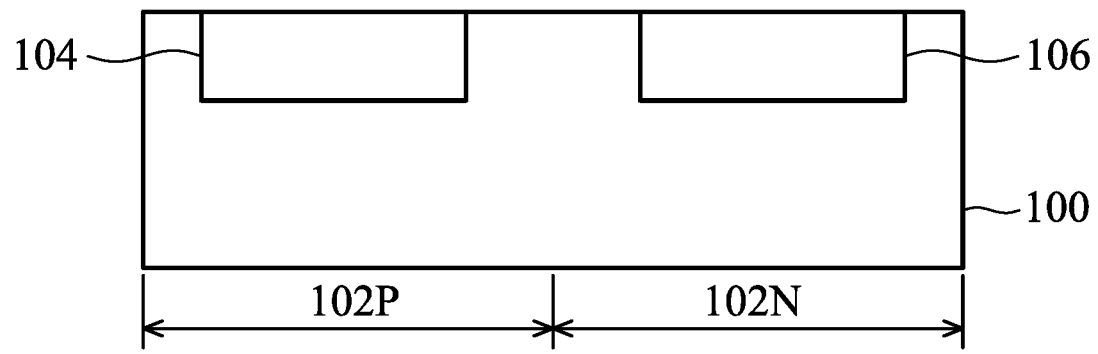
FIGS. 1A-1N are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in some various examples. This repetition is for the purpose of simplicity and clarity and does not in itself dictate a relationship between some various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 1B:
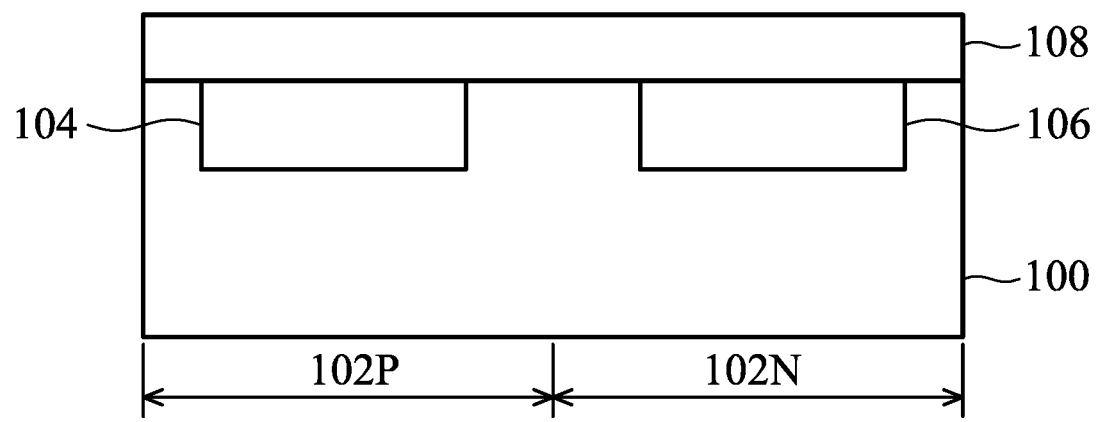
Figure 1C:
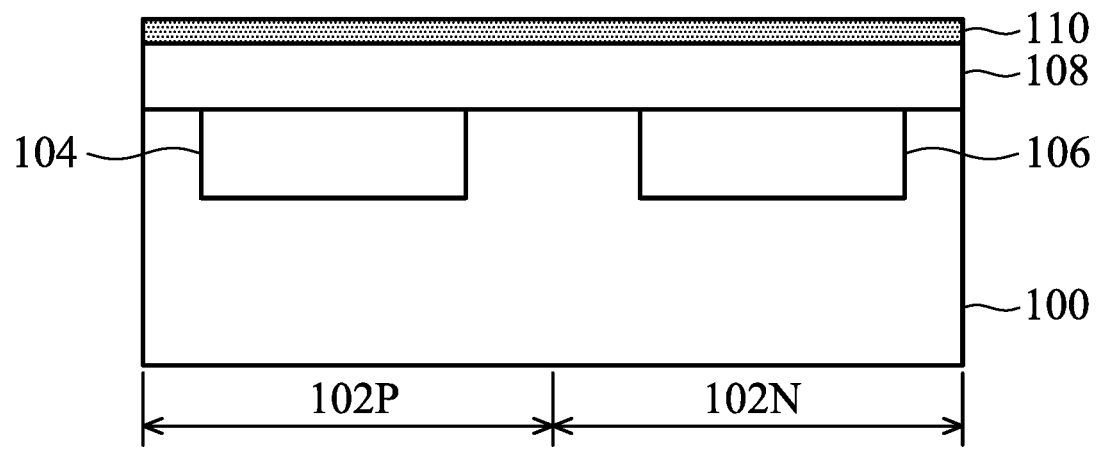
Figure 1D:
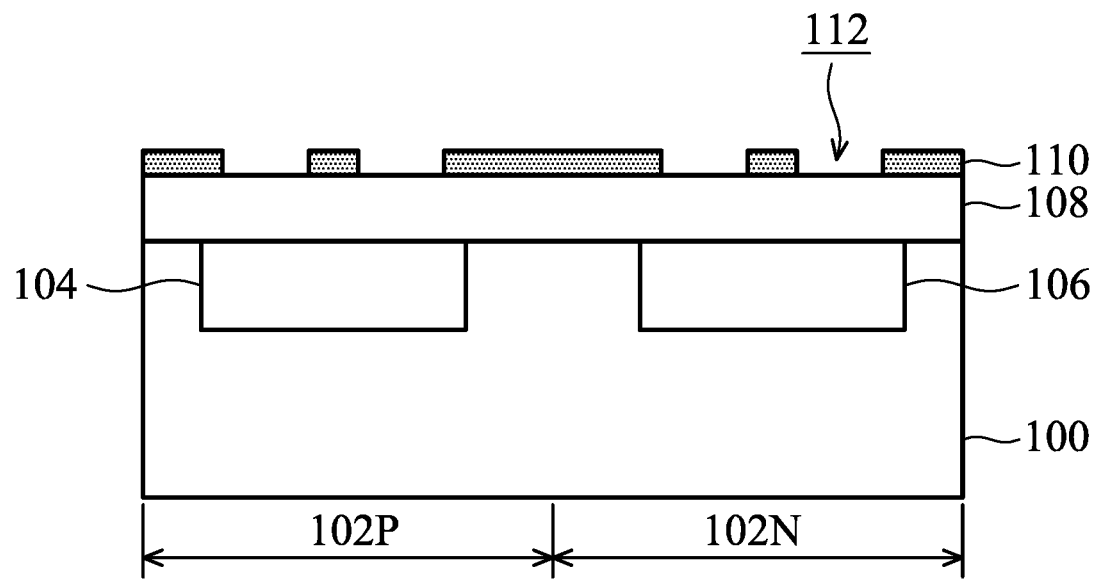
Figure 1E:
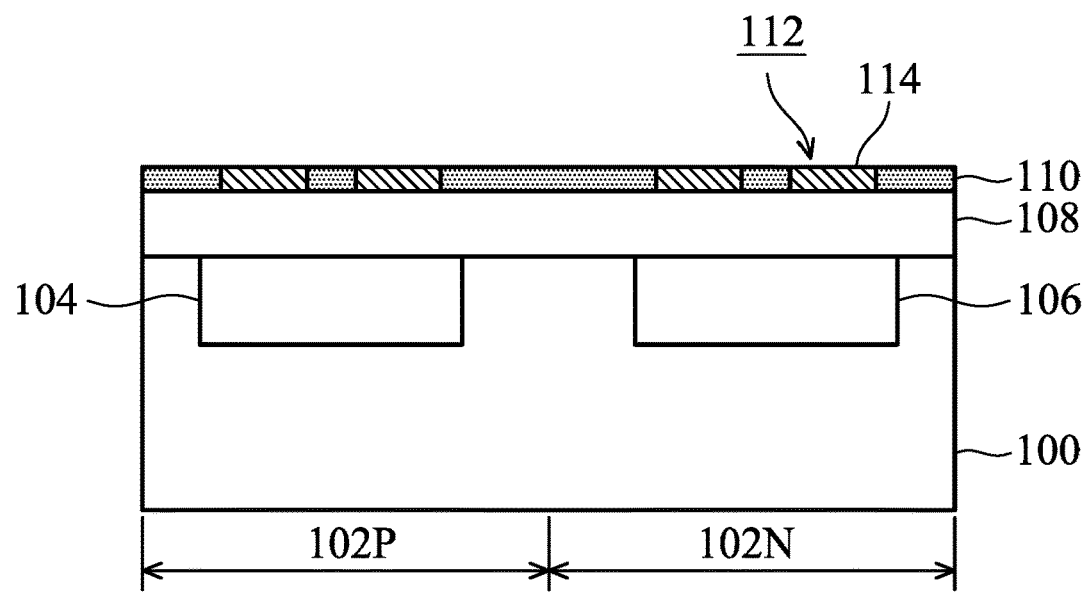
Figure 1F:
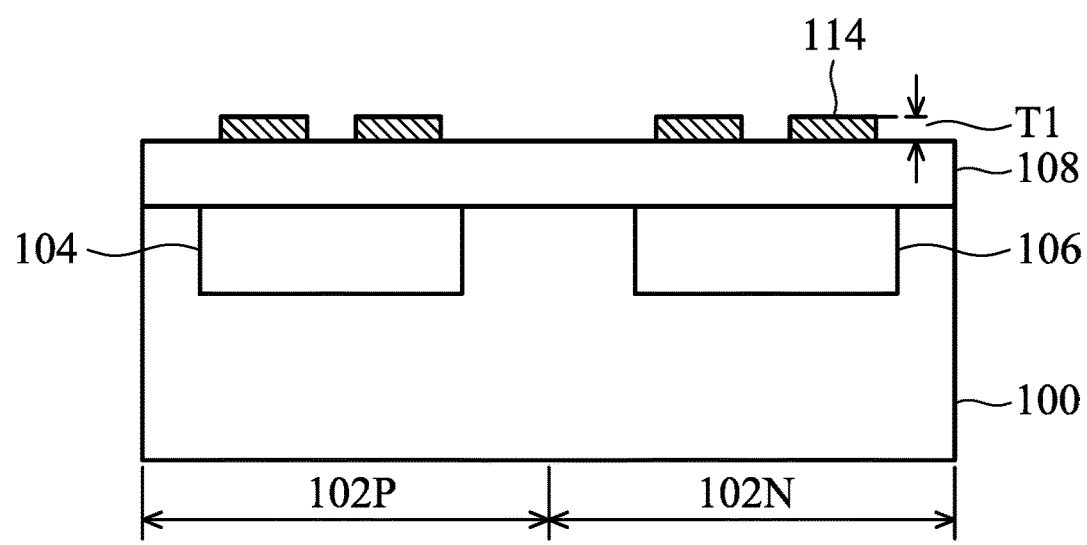
Figure 1G:
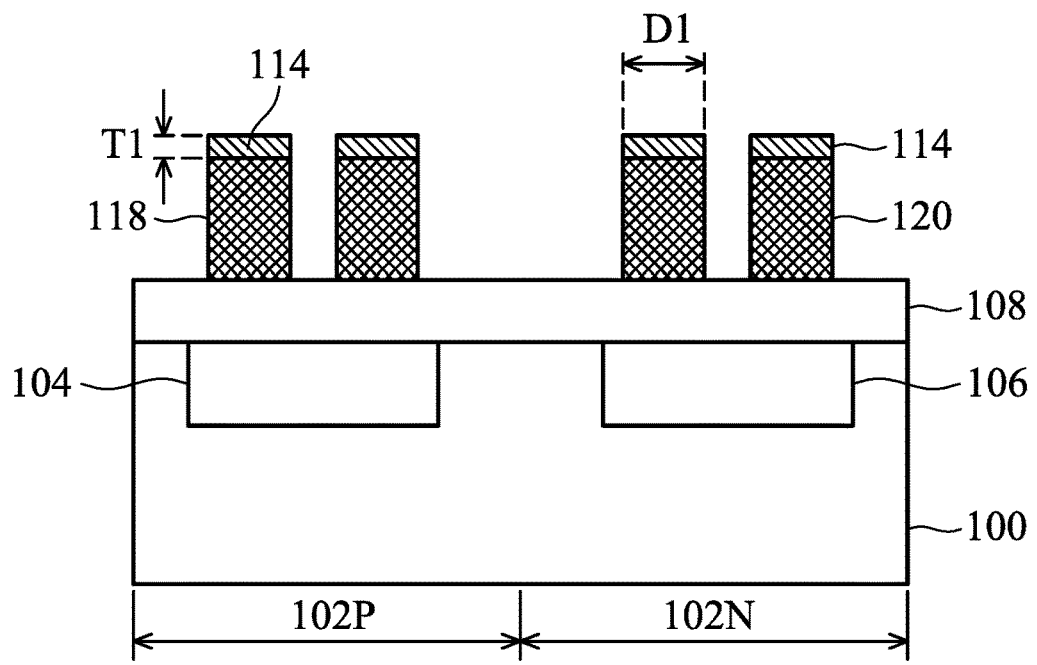
Figure 1H:
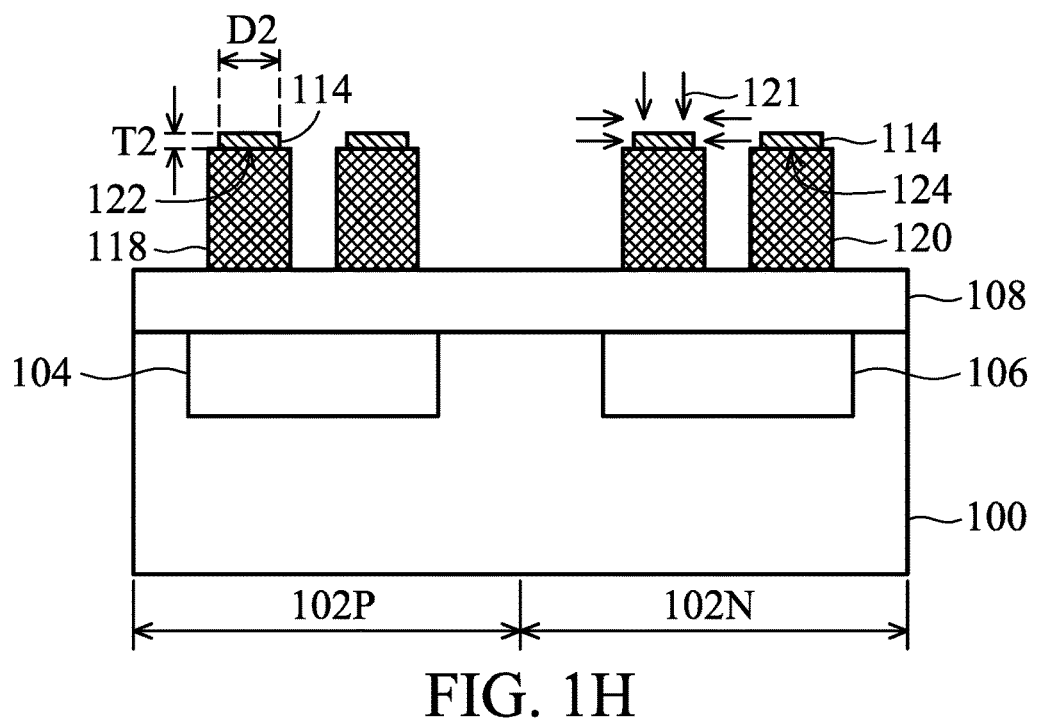
Figure 1I:
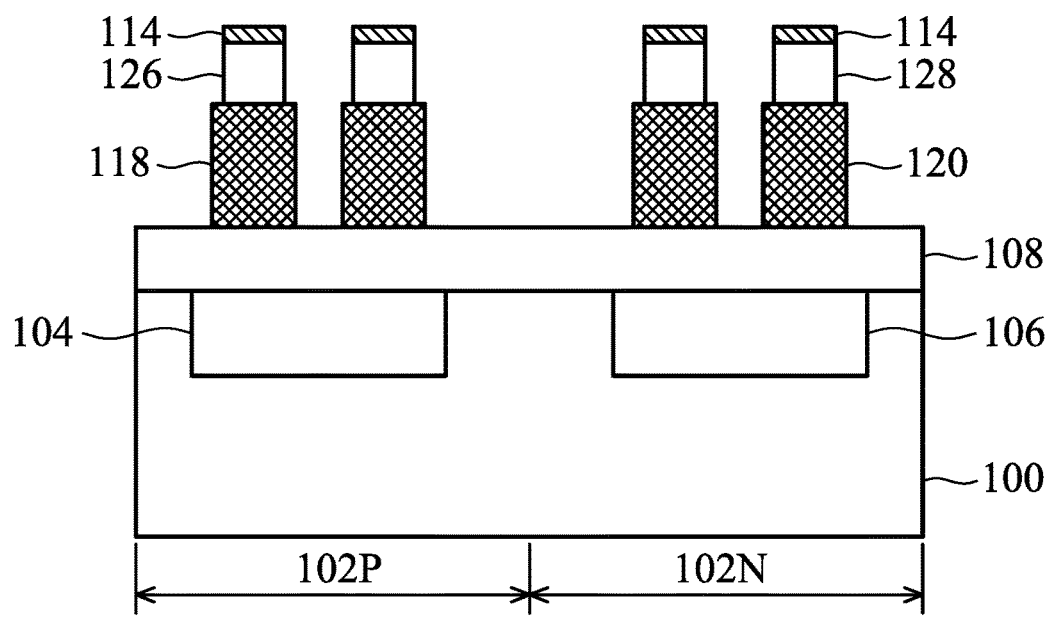
Figure 1J:
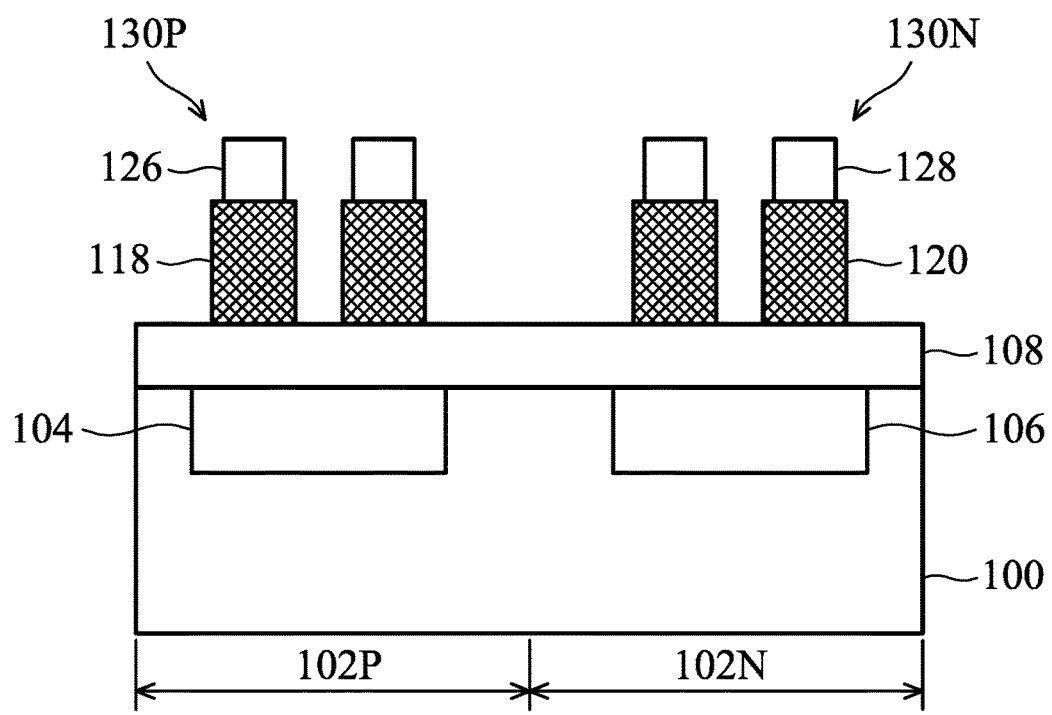
Figure 1K:
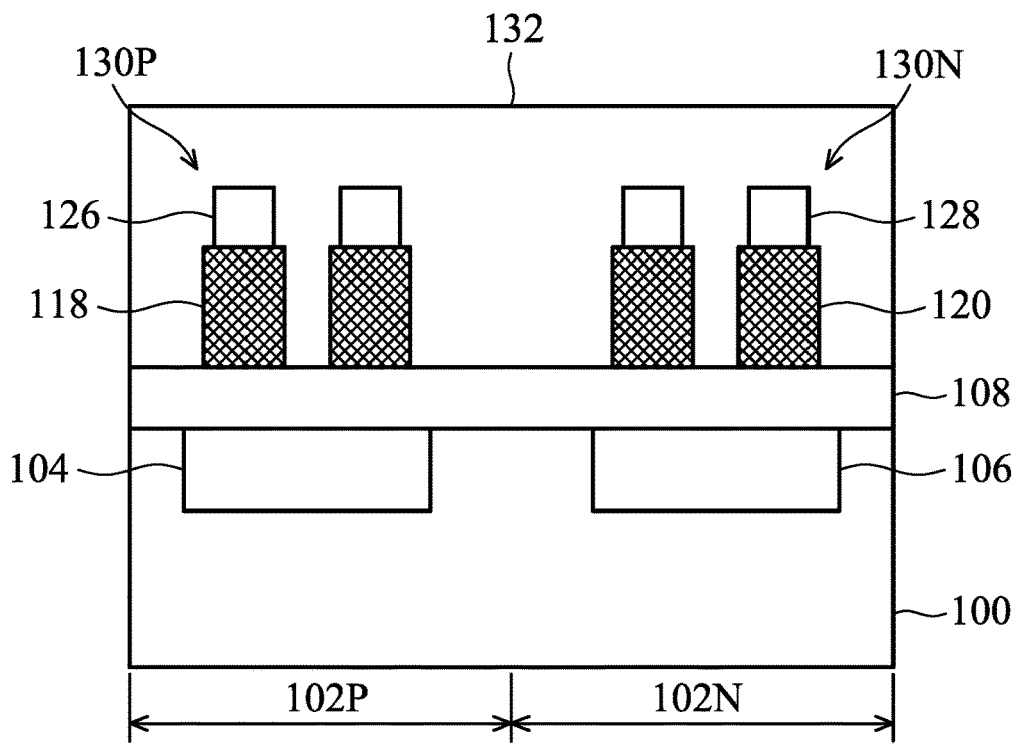
Figure 1L:
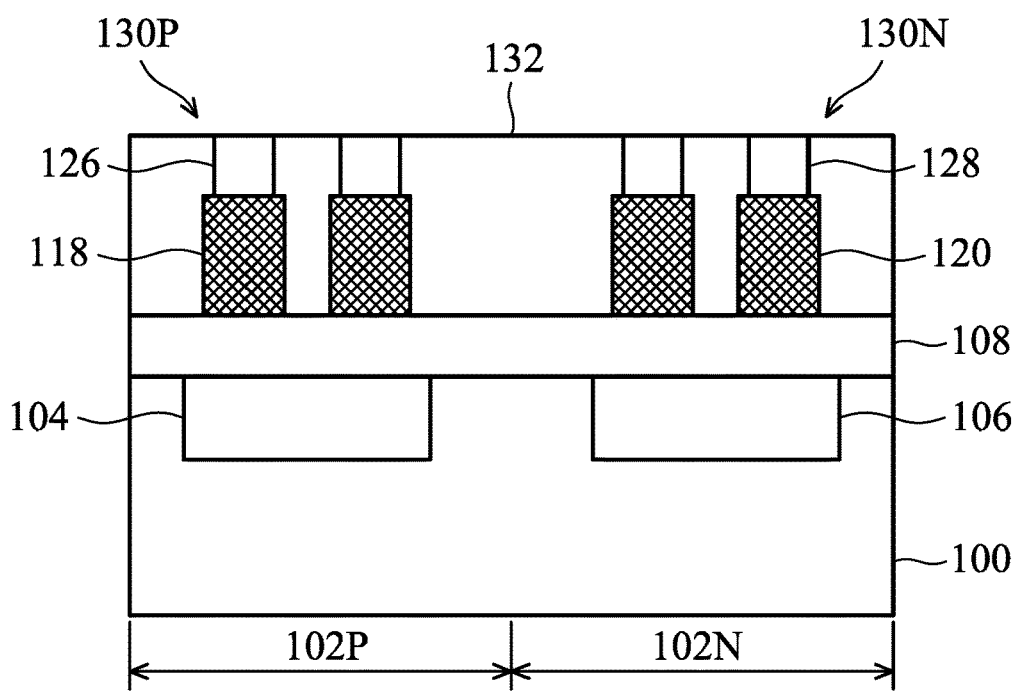
Figure 1M:
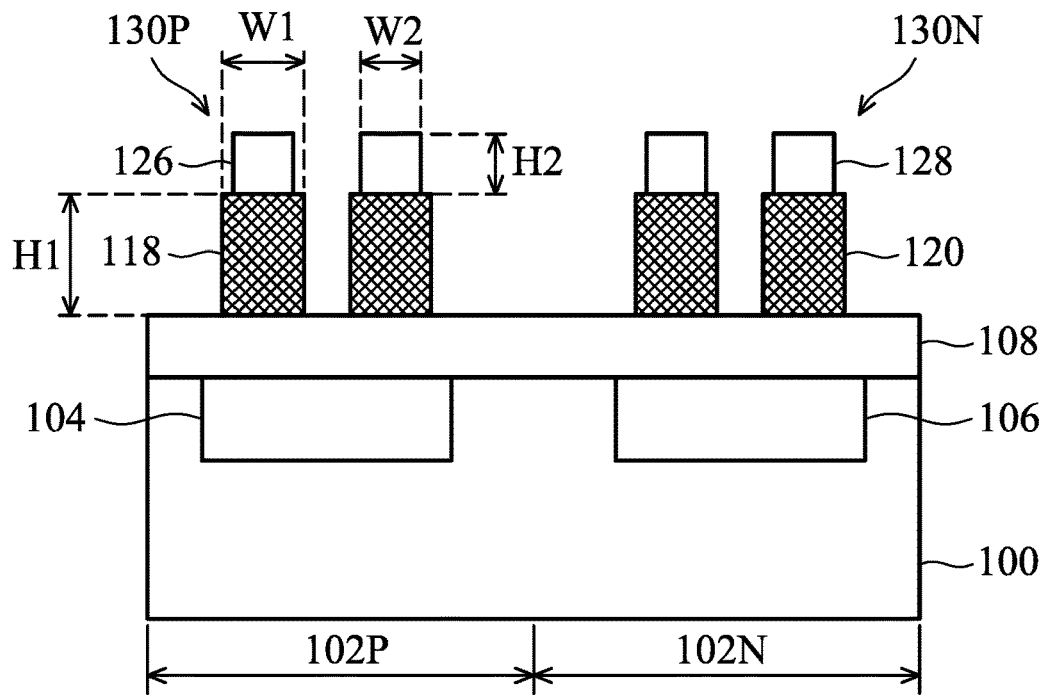
Figure 1N:
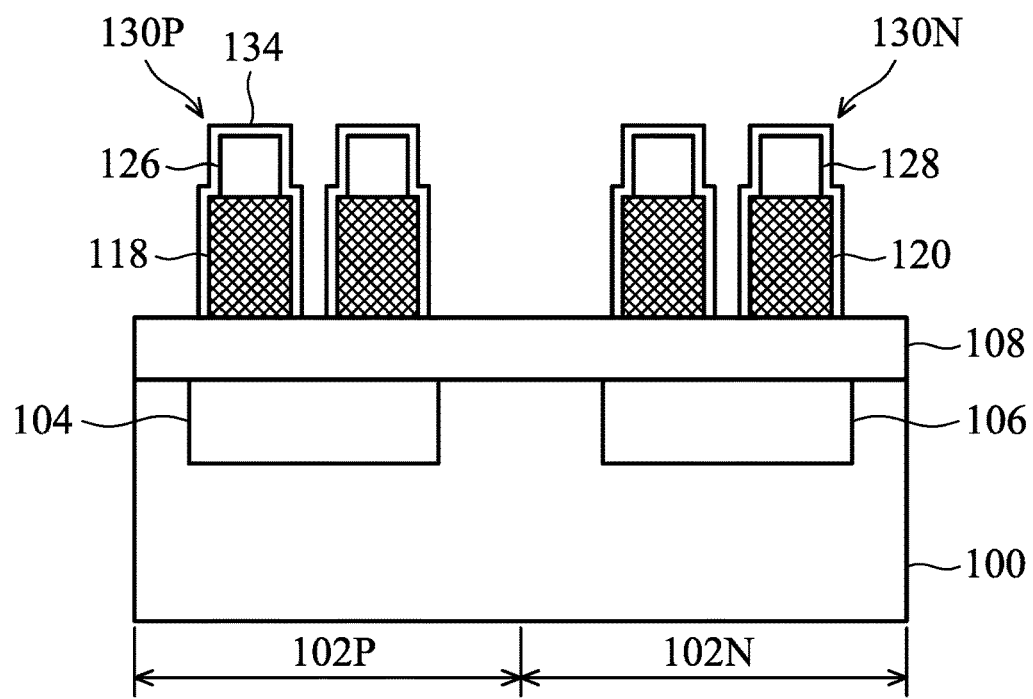

FIGS. 1A-1N are cross-sectional views of various stages of a process for forming a semiconductor device structure, in accordance with some embodiments. As shown in FIG. 1A, a semiconductor substrate 100 is received or provided in accordance with some embodiments. In some embodiments, the semiconductor substrate 100 is a bulk semiconductor substrate, such as a semiconductor wafer. For example, the semiconductor substrate 100 is a silicon wafer. The semiconductor substrate 100 may include silicon or another elementary semiconductor material such as germanium. In some other embodiments, the semiconductor substrate 100 includes a compound semiconductor. The compound semiconductor may include gallium arsenide, silicon carbide, indium arsenide, indium phosphide, another suitable material, or a combination thereof.

In some embodiments, the semiconductor substrate 100 includes a semiconductor-on-insulator (SOI) substrate. The SOI substrate may be fabricated using a separation by implantation of oxygen (SIMOX) process, a wafer bonding process, another applicable method, or a combination thereof.

In some embodiments, the semiconductor substrate 100 is an un-doped substrate. However, in some other embodiments, the semiconductor substrate 100 is a doped substrate such as a P-type substrate or an N-type substrate.

As shown in FIG. 1A, the semiconductor substrate 100 has a P-type field-effect transistor region 102P (PFET region 102P) and an N-type field-effect transistor region 102N (NFET region 102N) adjacent to the PFET region 102P, in accordance with some embodiments. In some embodiments, the PFET region 102P is used to form a PFET structure therein, whereas the NFET region 102N is used to form an NFET structure therein. In some embodiments, the PFET region 102P is also referred to as a first conductive type field-effect transistor region 102P, and the NFET region 102N is also referred to as a second conductive type field-effect transistor region 102N.

In some embodiments, an N-well region 104 and a P-well region 106 are formed sequentially in the semiconductor substrate 100, as shown in FIG. 1A. As shown in FIG. 1A, the N-well region 104 is formed in the semiconductor substrate 100 in the PFET region 102P, whereas the P-well region 106 is formed in the semiconductor substrate 100 in the NFET region 102N, in accordance with some embodiments. As shown in FIG. 1A, the N-well region 104 and the P-well region 106 are separated from each other, in accordance with some embodiments.

In some embodiments, separate ion implantation processes are performed to form the P-well region 106 and the N-well region 104, respectively. By using two different implantation mask layers, the P-well region 106 and the N-well region 104 are formed sequentially in different ion implantation processes.

In some embodiments, a first implantation mask layer (not shown) is used to cover a portion of the semiconductor substrate 100 in the PFET region 102P. The first implantation mask layer has an opening which exposes another portion of the semiconductor substrate 100 in the NFET region 102N. In some embodiments, the first implantation mask layer is a patterned photoresist layer. In some other embodiments, the first implantation mask layer is a patterned dielectric layer, such as a silicon nitride layer. Afterwards, a first ion implantation process is performed on the exposed portion of the semiconductor substrate 100 in the NFET region 102N to form a well region such as the P-well region 106. For example, P-type dopants such as boron or $BF_2$ are implanted into the exposed portion of the semiconductor substrate 100 to form the P-well region 106. The first implantation mask layer is then removed.

Afterwards, a second implantation mask layer (not shown) is used to cover the P-well region 106 in some embodiments. The second implantation mask layer has an opening which exposes the portion of the semiconductor substrate 100 in the PFET region 102P previously covered by the first implantation mask layer. In some embodiments, the second implantation mask layer is a patterned photoresist layer. In some other embodiments, the second implantation mask layer is a patterned dielectric layer, such as a silicon nitride layer. Afterwards, a second ion implantation process is performed to form a well region such as the N-well region 104. For example, N-type dopants such as phosphor or arsenic are implanted into the exposed portion of the semiconductor substrate 100 in the PFET region 102P to form the N-well region 104.

Afterward, as shown in FIG. 1B, a semiconductor material layer 108 is deposited over the semiconductor substrate 100, in accordance with some embodiments. In some embodiments, the semiconductor material layer 108 is substantially made of silicon. In some other embodiments, the semiconductor material layer 108 is substantially made of Ge, Si/Ge, III-V compound, or a combination thereof.

In some embodiments, the semiconductor material layer 108 may be formed by an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable method. In some embodiments, the semiconductor material layer 108 is an un-doped semiconductor material layer. The thickness of the semiconductor material layer 108 is in a range from about 2 nm to about 20 nm, for example, from about 5 nm to about 10 nm.

As shown in FIG. 1C, a dielectric layer 110 is subsequently formed over the semiconductor layer 108, in accordance with some embodiments. In some embodiments, a dielectric material layer is deposited to cover the semiconductor layer 108. In some embodiments, the dielectric material layer is made of silicon oxide, silicon oxynitride, silicon nitride, another suitable material, or a combination thereof. In some embodiments, the dielectric material layer is deposited using a CVD process, an ALD process, a spin-on process, a spray coating process, another applicable process, or a combination thereof.

As shown in FIG. 1D, in some embodiments, openings 112 are formed in the dielectric layer 110 to expose the semiconductor layer 108 over the PFET region 102P and the NFET region 102N. In some embodiments, some openings 112 are over the N-well region 104, and some other openings 112 are over the P-well region 106.

In some embodiments, the formation of the openings 112 includes patterning the dielectric layer 110 by a photolithography process, etching the exposed surface of the dielectric layer 110 (for example, by using a dry etching process, a wet etching process, a plasma etching process, or a combination thereof) to form the openings 112.

As shown in FIG. 1E, one (or more) metal portion 114 is formed in the openings 112 and formed over the semiconductor layer 108. In some embodiments, the metal portion 114 includes one (or more) metal.

In some embodiments, a metal layer is deposited over the dielectric layer 110 and fills into the openings 112. In some embodiments, the metal layer is deposited by using chemical vapor deposition (CVD), sputtering, resistive thermal evaporation, electron beam evaporation, or another applicable method.

Afterwards, a planarization process may be used to partially remove the metal layer. The metal layer may be partially removed until the dielectric layer 110 is exposed. As a result, the metal layer that remains in the openings forms the metal portions 114. In some embodiments, the planarization process includes a CMP process, a grinding process, a dry polishing process, an etching process, another applicable process, or a combination thereof.

In some embodiments, the materials of all the metal portions 114 are the same, and the metal portions 114 are formed by the same metal deposited in the same deposition steps. However, in some other embodiments, one or more of the metal portions 114 are formed by a deposition step different from the deposition step used to form other metal portions 114, and the materials of one or more of the metal portions 114 are different from the others.

Afterward, as shown in FIG. 1F, the dielectric layer 110 is removed, in accordance with some embodiments. In some embodiments, sidewalls of the metal portions 114 are exposed. As shown in FIG. 1F, the bottom surface of the metal portion 114 is in direct contact with the semiconductor material layer 108, in accordance with some embodiments. As shown in FIG. 1F, there is an interface 116 between the metal portion 114 and the semiconductor layer 108.

As shown in FIG. 1F, the metal portions 114 have a thickness T1 in a range from about 1 nm to about 10 nm, for example from about 2 nm to about 5 nm, in accordance with some embodiments. In some cases, if the thickness T1 is too great, for example greater than 10 nm, the growth of the subsequent semiconductor nanowire would be too slow. However, in some other cases, if the thickness T1 is too small, for example smaller than 3 nm, the subsequent semiconductor nanowire cannot be grown efficiently.

As shown in FIG. 1G, a first semiconductor portion 118 is grown from the interface 116 between the metal portion 114 and the semiconductor layer 108 in the PFET region 102P, in accordance with some embodiments. In some embodiments, the first semiconductor portion 118 is over the N-well region 104.

As shown in FIG. 1G, the growth of the first semiconductor portion 118 separates the metal portion 114 apart from the semiconductor layer 108, in accordance with some embodiments. Therefore, as shown in FIG. 1G, after the growth of the first semiconductor portion 118, the metal portion 114 is over the first semiconductor portion 118, in accordance with some embodiments.

As shown in FIG. 1G, a third semiconductor portion 120 is grown from the interface 116 between the metal portion 114 and the semiconductor layer 108 in the NFET region 102N, in accordance with some embodiments. In some embodiments, the third semiconductor portion 120 is over the P-well region 106.

As shown in FIG. 1G, the growth of the third semiconductor portion 120 separates the metal portion 114 apart from the semiconductor layer 108, in accordance with some embodiments. Therefore, as shown in FIG. 1G, after the growth of the third semiconductor portion 120, the metal portion 114 is over the third semiconductor portion 120, in accordance with some embodiments.

In some embodiments, the first semiconductor nanowire 118 is made of silicon, silicon germanium, silicon carbide, or another suitable material. In some embodiments, the third semiconductor portion 120 is made of silicon, silicon germanium, silicon carbide, or another suitable material.

Figure 2A:
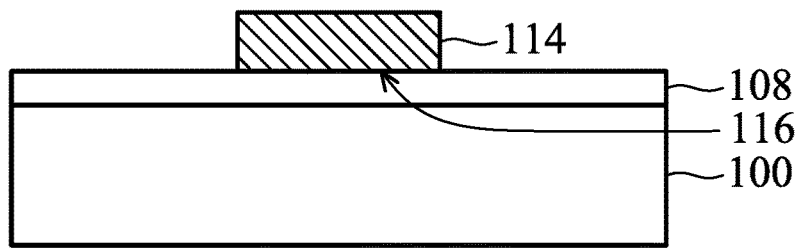
FIGS. 2A-2C are cross-sectional views of various stages of a process for forming a semiconductor nanowire, in accordance with some embodiments.
Figure 2B:
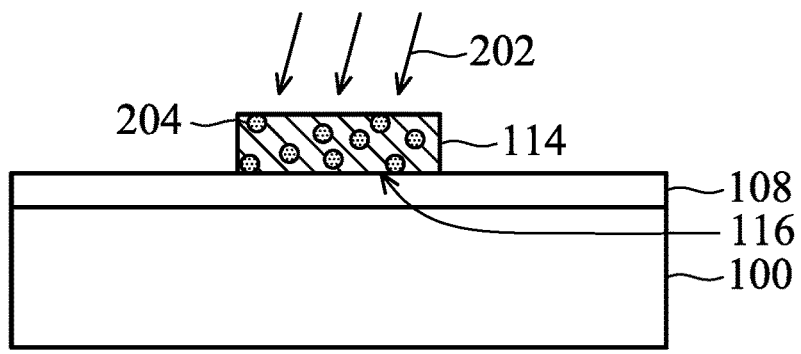
Figure 2C:
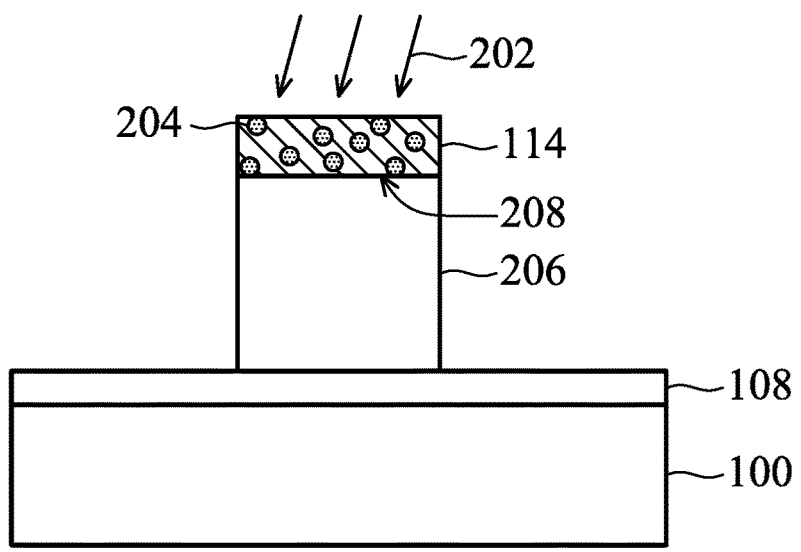

In some embodiments, the first semiconductor portion 118 and/or the third semiconductor portion 120 are grown by a vapor-liquid-solid method shown in FIGS. 2A-2C. In some other embodiments, the first semiconductor portion 118 and/or the third semiconductor portion 120 are grown by a vapor-solid-solid method shown in FIGS. 3A-3C.

FIGS. 2A-2C are cross-sectional views of various stages of a process for forming a semiconductor nanowire 206 by a vapor-liquid-solid method, in accordance with some embodiments. The N-well region and/or the P-well region are not shown in order to clearly describe the embodiments of the present disclosure. FIGS. 2A-2C merely show one metal portion and/or one semiconductor nanowire for the sake of brevity. In some embodiments, the semiconductor nanowire 206 represents the aforementioned first semiconductor portion 118 in the PFET region 102P. In some other embodiments, the semiconductor nanowire 206 represents the third semiconductor portion 120 in the NFET region 102N.

As shown in FIG. 2A, there is an interface 116 between the metal portion 114 and the semiconductor layer 108, in accordance with some embodiments. As shown in FIG. 2B, a gaseous precursor 202 is provided and is applied to the metal portion 114, in accordance with some embodiments.

In some embodiments, the gaseous precursor 202 includes an elementary semiconductor material in gaseous state. In some embodiments, the gaseous precursor 202 includes dichlorosilane, silicon tetrahydride, germane, methylsilane, or a combination thereof. In some embodiments, the gaseous precursor 202 includes one or more elementary semiconductor materials such as silicon, germanium, and/or carbon in gaseous state.

In some embodiments, the metal portion 114 includes one or more metal, and the metal includes Au, Al, Zn, Ga, in, Sn, Sb, Cd, Ag, Ti, Pd, Pt, alloys thereof, another metal which may form a liquid portion with the semiconductor material, or those metal showing characteristic of eutectic phase reaction with Si/SiC/SiGe, or a combination thereof.

In some embodiments, the metal includes Au, Al, Zn, Ga, in, Sn, Sb, Cd, Ag, alloys thereof, or a combination thereof. In some embodiments, these metal or alloys may prevent the formation of the silicide at the interface 116 between the metal portion 114 and the semiconductor layer 108 or the interface between the metal portion 114 and the subsequent semiconductor nanowire, which in turn improve the quality of the grown semiconductor nanowire.

As shown in FIG. 2B, the metal portion 114 is heated to a higher temperature than the eutectic temperature of the metal and the elementary semiconductor material, in accordance with some embodiments. In some embodiments, the metal portion 114 absorbs the elementary semiconductor material and forms one or more liquid portions 204 in the metal portion 114, as shown in FIG. 2B. In some embodiments, the liquid portion 204 includes the metal and the elementary semiconductor material in a liquid state.

As shown in FIG. 2B, one or more liquid portions 204 contact the interface 116 between the metal portion 114 and the semiconductor layer 108, in accordance with some embodiments. In some embodiments, since the liquid portions 204 would move or flow in the metal portion 114, substantially all the interface 116 would be contacted by the liquid portions 204 during the growth process of the semiconductor nanowire 206 shown in FIGS. 2B-2C.

As shown in FIG. 2C, as the gaseous precursor 202 is continuously applied, the content of the elementary semiconductor material in the liquid portion 204 is continuously increased, in accordance with some embodiments. Therefore, the content of the elementary semiconductor material in the liquid portion 204 exceeds the equilibrium content between the elementary semiconductor material and the metal in a liquid state. Thereby, the elementary semiconductor material is precipitated from the liquid portion 204 and is crystallized at the interface 116 between the metal portion 114 and the semiconductor layer 108 with the semiconductor layer 108 serving as a seed layer. Thereby, the semiconductor nanowire 206 is grown from the interface 116 between the metal portion 114 and the semiconductor layer 108. In some embodiments, the crystallized elementary semiconductor material is in a solid state. Therefore, In some embodiments, the growth of the semiconductor nanowire 206 separates the metal portion 114 apart from the semiconductor layer 108.

Afterward, the elementary semiconductor material is precipitated from the liquid portion 204 and is crystallized at the interface 208 between the metal portion 114 and the semiconductor nanowire 206 such that the semiconductor nanowire 206 is continuously grown. Afterward, by stopping the application of the gaseous precursor 202, the growth of the semiconductor nanowire 206 is stopped. As shown in FIG. 2C, after the growth of the semiconductor nanowire 206, the metal portion 114 is over the semiconductor nanowire 206, in accordance with some embodiments.

In some embodiments, since the elementary semiconductor material goes through a vapor state, a liquid state, and a solid state in the method shown in FIGS. 2A-2C, the method is referred as a vapor-liquid-solid method.

In some embodiments, the vapor-liquid-solid method is performed at a temperature ranging from about 200° C. to about 500° C., for example from about 300° C. to about 400° C.

In some embodiments, the elementary semiconductor materials such as silicon, germanium, and/or carbon are dissolved from the gaseous precursor 202 and the dissolving process produces hydrogen gas. In some embodiments of the present disclosure, another hydrogen gas is provided during the growth of the semiconductor nanowire 206 to control the dissolution and the content of the elementary semiconductor material. However, in some other embodiments of the present disclosure, another hydrogen gas is not provided.

Figure 3A:
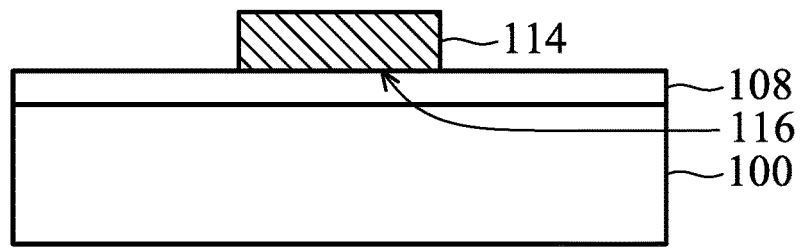
FIGS. 3A-3C are cross-sectional views of various stages of a process for forming a semiconductor nanowire, in accordance with some embodiments.
Figure 3B:
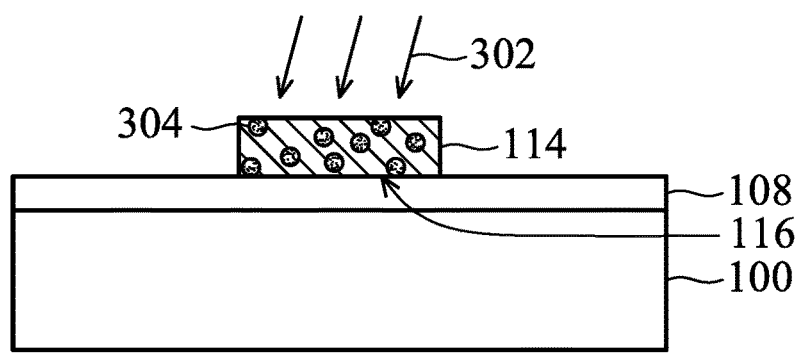
Figure 3C:
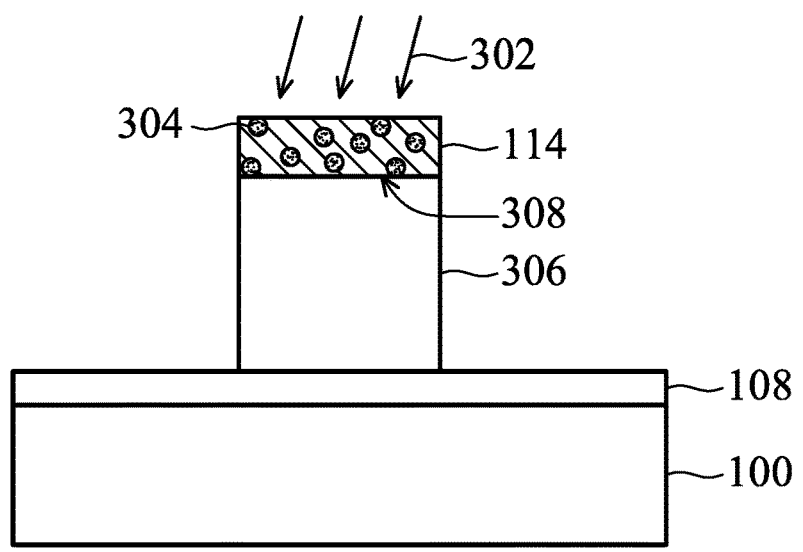

FIGS. 3A-3C are cross-sectional views of various stages of a process for forming a semiconductor nanowire 304 by a vapor-solid-solid method, in accordance with some embodiments. The N-well region and/or the P-well region are not shown in order to clearly describe the embodiments of the present disclosure. FIGS. 3A-3C merely show one metal portion and/or one semiconductor nanowire for the sake of brevity. In some embodiments, the semiconductor nanowire 304 represents the aforementioned first semiconductor portion 118 in the PFET region 102P. In some other embodiments, the semiconductor nanowire 306 represents the third semiconductor portion 120 in the NFET region 102N.

As shown in FIG. 3A, there is an interface 116 between the metal portion 114 and the semiconductor layer 108, in accordance with some embodiments. As shown in FIG. 3B, a gaseous precursor 302 is provided and is applied to the metal portion 114, in accordance with some embodiments.

In some embodiments, the gaseous precursor 302 includes an elementary semiconductor material in gaseous state. In some embodiments, the gaseous precursor 302 includes dichlorosilane, silicon tetrahydride, germane, methylsilane, or a combination thereof. In some embodiments, the gaseous precursor 302 includes one or more elementary semiconductor materials such as silicon, germanium, and/or carbon in gaseous state.

In some embodiments, the metal portion 114 includes one or more metal, and the metal includes Au, Al, Zn, Ga, in, Sn, Sb, Cd, Ag, Ti, Pd, Pt, alloys thereof, another metal which may form a metal-semiconductor material solid compound with the semiconductor material, or a combination thereof.

In some embodiments, the metal includes Au, Al, Zn, Ga, in, Sn, Sb, Cd, Ag, alloys thereof, or a combination thereof. In some embodiments, these metal or alloys may prevent the formation of the silicide at the interface 116 between the metal portion 114 and the semiconductor layer 108 or the interface between the metal portion 114 and the subsequent semiconductor nanowire, which in turn improve the quality of the grown semiconductor nanowire.

In some embodiments, the temperature of the metal portion 114 is lower than an eutectic temperature of the metal and the elementary semiconductor material. The metal portion 114 absorbs the elementary semiconductor material and forms one (or more) metal-semiconductor material solid compound 304 in the metal portion 114, as shown in FIG. 3B. In some embodiments, the metal-semiconductor material solid compound 304 includes the elementary semiconductor material in a solid state As shown in FIG. 3B, one or more metal-semiconductor material solid compound 304 contacts the interface 116 between the metal portion 114 and the semiconductor layer 108, in accordance with some embodiments. In some embodiments, since the metal in the metal portion 114 diffuses into the metal-semiconductor material solid compound 304, and/or the metal in the metal-semiconductor material solid compound 304 diffuses into the metal portion 114, the metal-semiconductor material solid compound 304 would move or flow in the metal portion 114, and substantially all the interface 116 would be contacted by the metal-semiconductor material solid compound 304 during the growth process of the semiconductor nanowire 306 shown in FIGS. 3B-3C.

As shown in FIG. 3C, as the gaseous precursor 302 is continuously applied, the content of the elementary semiconductor material in the metal-semiconductor material solid compound 304 is continuously increased, in accordance with some embodiments. As the content of the elementary semiconductor material in the metal-semiconductor material solid compound 304 exceeds the equilibrium content between the elementary semiconductor material and the metal in a solid state, the elementary semiconductor material is precipitated from the metal-semiconductor material solid compound 304 and is crystallized at the interface 116 between the metal portion 114 and the semiconductor layer 108 with the semiconductor layer 108 serving as a seed layer.

Thereby, the semiconductor nanowire 306 is grown from the interface 116 between the metal portion 114 and the semiconductor layer 108. In some embodiments, the crystallized elementary semiconductor material is in a solid state. Therefore, In some embodiments, the growth of the semiconductor nanowire 306 separates the metal portion 114 apart from the semiconductor layer 108.

Afterward, the elementary semiconductor material is precipitated from the metal-semiconductor material solid compound 304 and is crystallized at the interface 308 between the metal portion 114 and the semiconductor nanowire 306 such that the semiconductor nanowire 306 is continuously grown. Afterward, by stopping the application of the gaseous precursor 302, the growth of the semiconductor nanowire 306 is stopped. As shown in FIG. 3C, after the growth of the semiconductor nanowire 306, the metal portion 114 is over the semiconductor nanowire 306, in accordance with some embodiments.

In some embodiments, since the elementary semiconductor material goes through a vapor state, a solid state, and another solid state in the method shown in FIGS. 3A-3C, the method is referred as a vapor-solid-solid method.

In some embodiments, the vapor-solid-solid method is performed at a temperature ranging from about 200° C. to about 500° C., for example from about 300° C. to about 400° C.

In some embodiments, the elementary semiconductor materials such as silicon, germanium, and/or carbon are dissolved from the gaseous precursor 302 and the dissolving process produces hydrogen gas. In some embodiments of the present disclosure, another hydrogen gas is provided during the growth of the semiconductor nanowire 306 to control the dissolution and the content of the elementary semiconductor material. However, in some other embodiments of the present disclosure, another hydrogen gas is not provided.

In some embodiments, since the vapor-solid-solid method and/or the vapor-liquid-solid method grow the semiconductor nanowire or the semiconductor portion by precipitating the elementary semiconductor material from the liquid portion or the metal-semiconductor material solid compound, the grown semiconductor nanowire or semiconductor portion is a single crystal and is defect-free. Thereby, the quality of the semiconductor device structure may be improved.

According to the methods mentioned above, the first semiconductor portion 118 and/or the third semiconductor portion 120 are grown by the vapor-liquid-solid method or by the vapor-solid-solid method. In some embodiments, during the growth process of the first semiconductor portion 118 and/or the third semiconductor portion 120, a gaseous dopant precursor is provided to dope the first semiconductor portion 118/or and the third semiconductor portion 120. In some embodiments, the gaseous dopant precursor includes phosphine, diborane, another suitable gaseous dopant precursor, or a combination thereof.

Referring to FIG. 1H, after the first semiconductor portion 118 and the third semiconductor portion 120 are grown by the vapor-liquid-solid method or by the vapor-solid-solid method, the metal portion 114 is partially etched by a partial etching process 121. Note that the partial etching process 121 is merely shown on one metal portion 114 for the sake of clarity. However, the embodiments of the present disclosure are not limited thereto. In some embodiments, the metal portion 114 is partially etched by applying controlled a gaseous etchant such as hydrogen gas, by performing a plasma etching process, or another applicable process. (I add the explanation in para. [0078], and FIG. 4C-4F)

As shown in FIG. 1G, a top portion and a side portion of the metal portions 114 is removed in the partial etching process 121, in accordance with some embodiments. Therefore, in some embodiments of the present disclosure, before the metal portion 114 is partially etched, the metal portion 114 has a first length D1, in accordance with some embodiments. As shown in FIG. 1H, after the metal portion 114 is partially etched, the metal portion 114 has a second length D2, and the second length D2 is shorter than the first length D1, in accordance with some embodiments. In some embodiments of the present disclosure, before the metal portion 114 is partially etched, the metal portion 114 has a thickness T1, in accordance with some embodiments. As shown in FIG. 1H, after the metal portion 114 is partially etched, the metal portion 114 has a thickness T2, and the thickness T2 is less than the thickness T1, in accordance with some embodiments.

As shown in FIG. 1H, there is an interface 122 between the etched metal portion 114 and the first semiconductor portion 118, in accordance with some embodiments. As shown in FIG. 1H, there is an interface 124 between the etched metal portion 114 and the third semiconductor portion 120, in accordance with some embodiments.

As shown in FIG. 1I, a second semiconductor portion 126 is grown from the interface 122 between the etched metal portion 114 and the first semiconductor portion 118 by the vapor-liquid-solid method or by the vapor-solid-solid method, in accordance with some embodiments. In some embodiments, the growth of the second semiconductor portion 126 separates the etched metal portion 114 apart from the first semiconductor portion 118. As shown in FIG. 1I, after the growth of the second semiconductor portion 126, the etched metal portion 114 is over the second semiconductor portion 126, in accordance with some embodiments.

As shown in FIG. 1I, a fourth semiconductor portion 128 is grown from the interface 124 between the etched metal portion 114 and the third semiconductor portion 120 by the vapor-liquid-solid method or by the vapor-solid-solid method, in accordance with some embodiments. In some embodiments, the growth of the fourth semiconductor portion 128 separates the etched metal portion 114 apart from the third semiconductor portion 120. As shown in FIG. 1I, after the growth of the fourth semiconductor portion 128, the etched metal portion 114 is over the fourth semiconductor portion 128, in accordance with some embodiments.

In some embodiments, the second semiconductor nanowire 126 is made of silicon, silicon germanium, silicon carbide, or another suitable material. In some embodiments, the fourth semiconductor portion 128 is made of silicon, silicon germanium, silicon carbide, or another suitable material.

In some embodiments, during the growth process of the second semiconductor portion 126 and/or the fourth semiconductor portion 128, a gaseous dopant precursor is provided to dope the second semiconductor portion 126 and/or the fourth semiconductor portion 128. In some embodiments, the gaseous dopant precursor includes phosphine, diborane, another suitable gaseous dopant precursor, or a combination thereof.

As shown in FIG. 1J, the etched metal portions 114 over the second semiconductor portion 126 and the fourth semiconductor portion 128 are removed, in accordance with some embodiments. In some embodiments, the etched metal portion 114 is removed by applying a gaseous etchant, by performing a plasma etching process, by performing a chemical mechanical polishing process (CMP process), or another applicable process.

As shown in FIG. 1J, the first semiconductor portion 118 and the second semiconductor portion 126 form a first semiconductor nanowire 130P in the PFET region 102P, in accordance with some embodiments. As shown in FIG. 1J, the third semiconductor portion 120 and the fourth semiconductor portion 128 form a second semiconductor nanowire 130N in the NFET region 102N, in accordance with some embodiments.

In some embodiments, the first semiconductor nanowire 130P and the second semiconductor nanowire 130N serve as the fin structures of the semiconductor device structure. In some embodiments, a portion of the second semiconductor portion 126 serve as the subsequent channel of a PFET device in the PFET region 102P, and a portion of the fourth semiconductor portion 128 serve as the subsequent channel of an NFET device in the NFET region 102N.

In some embodiments, the first semiconductor nanowire 130P and the second semiconductor nanowire 130N is formed by the vapor-solid-solid method and/or the vapor-liquid-solid method. Therefore, in some embodiments, the first semiconductor portion 118, the second semiconductor portion 126, the third semiconductor portion 120 and the fourth semiconductor portion 128 of the first semiconductor nanowire 130P and the second semiconductor nanowire 130N are single crystal and are defect-free. Thereby, the quality of the semiconductor device structure may be improved.

In some embodiments, the lattice distance in the first semiconductor portion 118 is substantially constant, and the first semiconductor portion 118 has a first lattice distance. In some embodiments, the lattice distance in the second semiconductor portion 126 is substantially constant, and the second semiconductor portion 126 has a second lattice distance. In some embodiments, the lattice distance in the third semiconductor portion 120 is substantially constant, and the third semiconductor portion 120 has a third lattice distance. In some embodiments, the lattice distance in the fourth semiconductor portion 128 is substantially constant, and the fourth semiconductor portion 128 has a fourth lattice distance.

In some embodiments, the semiconductor substrate 100 has a fifth lattice distance. In some embodiments, the first lattice distance of the first semiconductor portion 118 of the first semiconductor nanowire 130P is greater than the fifth lattice distance, whereas the second lattice distance of the third semiconductor portion 120 of the second semiconductor nanowire 130N is shorter than or equal to the fifth lattice distance.

In some embodiments, the semiconductor layer 108 has a sixth lattice distance. In some embodiments, the first lattice distance of the first semiconductor portion 118 of the first semiconductor nanowire 130P is greater than the sixth lattice distance, whereas the second lattice distance of the third semiconductor portion 120 of the second semiconductor nanowire 130N is shorter than or equal to the sixth lattice distance.

The formation sequence of the first semiconductor portion 118, the second semiconductor portion 126, the third semiconductor portion 120 and the fourth semiconductor portion 128 is not limited. In some embodiments, the first semiconductor portion 118 and the second semiconductor portion 126 are formed first. Afterward, the second semiconductor portion 126 is formed. Afterward, the fourth semiconductor portion 128 is formed. In some other embodiments, the first semiconductor portion 118 is formed first. Afterward, the second semiconductor portion 126 is formed. Afterward, the third semiconductor portion 120 is formed. Afterward, the fourth semiconductor portion 128 is formed.

In some embodiments, the material of the first semiconductor portion 118 is the same as the material of the second semiconductor portion 126. In some embodiments, the materials of the first semiconductor portion 118 and second semiconductor portion 126 are silicon or silicon germanium.

In some embodiments, the first lattice distance of the first semiconductor portion 118 is the same as the second lattice distance of the second semiconductor portion 126. In some embodiments, the first semiconductor portion 118 is formed by applying a first gaseous precursor, and the second semiconductor portion 126 is formed by applying a second gaseous precursor. In some embodiments, the first gaseous precursor is the same as the second gaseous precursor, such as dichlorosilane, silicon tetrahydride, or germane.

However, in some other embodiments of the present disclosure, the material of the first semiconductor portion 118 is different from the material of the second semiconductor portion 126. In some embodiments, the material of the first semiconductor portion 118 is silicon, and the material of second semiconductor portion 126 is silicon germanium. In some other embodiments, the material of the first semiconductor portion 118 is silicon germanium, and the material of second semiconductor portion 126 is silicon.

In some embodiments, the first lattice distance of the first semiconductor portion 118 is different the second lattice distance of the second semiconductor portion 126. In some embodiments, the first semiconductor portion 118 is formed by applying the first gaseous precursor, and the second semiconductor portion 126 is formed by applying the second gaseous precursor. In some embodiments, the first gaseous precursor is different from the second gaseous precursor.

In some embodiments, the material of the third semiconductor portion 120 is the same as the material of the fourth semiconductor portion 128. In some embodiments, the materials of the third semiconductor portion 120 and fourth semiconductor portion 128 are silicon or silicon carbide.

In some embodiments, the third lattice distance of the third semiconductor portion 120 is the same as the fourth lattice distance of the fourth semiconductor portion 128. In some embodiments, the third semiconductor portion 120 is formed by applying a third gaseous precursor, and the fourth semiconductor portion 128 is formed by applying a fourth gaseous precursor. In some embodiments, the third gaseous precursor is the same as the fourth gaseous precursor, such as dichlorosilane, silicon tetrahydride, or methylsilane.

However, in some other embodiments of the present disclosure, the material of the third semiconductor portion 120 is different from the material of the fourth semiconductor portion 128. In some embodiments, the material of the third semiconductor portion 120 is silicon, and the material of fourth semiconductor portion 128 is silicon carbide. In some other embodiments, the material of the third semiconductor portion 120 is silicon carbide, and the material of fourth semiconductor portion 128 is silicon.

In some embodiments, the third lattice distance of the third semiconductor portion 120 is different the fourth lattice distance of the fourth semiconductor portion 128. In some embodiments, the third semiconductor portion 120 is formed by applying the third gaseous precursor, and the fourth semiconductor portion 128 is formed by applying the fourth gaseous precursor. In some embodiments, the third gaseous precursor is different from the fourth gaseous precursor.

As shown in FIG. 1K, after the removal of the etched metal portion 114, a dielectric layer 132 is deposited over the first semiconductor nanowire 130P and second semiconductor nanowire 130N, in accordance with some embodiments. In some embodiments, the dielectric layer 132 is made of silicon oxide, silicon oxynitride, borosilicate glass (BSG), phosphoric silicate glass (PSG), borophosphosilicate glass (BPSG), fluorinated silicate glass (FSG), low-k material, porous dielectric material, another suitable material, or a combination thereof. In some embodiments, the dielectric layer 132 is deposited using a CVD process, an ALD process, a spin-on process, a spray coating process, another applicable process, or a combination thereof.

Afterwards, as shown in FIG. 1L, a planarization process may be used to thin down and partially remove the dielectric layer 132. The dielectric layer 132 may be partially removed until the first semiconductor nanowire 130P and second semiconductor nanowire 130N are exposed. As a result, the top surface of the first semiconductor nanowire 130P and second semiconductor nanowire 130N are planarized, and the height of the first semiconductor nanowire 130P and second semiconductor nanowire 130N can be controlled. In some embodiments, the planarization process includes a CMP process, a grinding process, a dry polishing process, an etching process, another applicable process, or a combination thereof.

Afterward, as shown in FIG. 1M, the dielectric layer 132 is removed, in accordance with some embodiments. In some embodiments, after the removal of the dielectric layer 132, the top surfaces and the side surfaces of the first semiconductor nanowire 130P and the second semiconductor nanowire 130N are oxidized to form oxide layers (not shown). Afterward, the oxide layers may be removed to further thin down and narrow the first semiconductor nanowire 130P and the second semiconductor nanowire 130N.

As shown in FIG. 1M, the first semiconductor nanowire 130P includes the first semiconductor portion 118 over the semiconductor substrate 100 and the second semiconductor portion 126 over the first semiconductor portion 118. As shown in FIG. 1M, the first semiconductor portion 118 has a first width W1, and the second semiconductor portion 126 has a second width W2, and the second width W2 is less than the first width W1, in accordance with some embodiments. In some embodiments, since the second width W2 of the second semiconductor portion 126 is less than the first width W1 of the first semiconductor portion 118, the structural stability of the first semiconductor nanowire 130P is improved.

As shown in FIG. 1M, the first semiconductor portion 118 has a first height H1, and the second semiconductor portion 126 has a second height H2, and the second height H2 is less than the first height H1, in accordance with some embodiments. In some embodiments, since the second height H2 of the second semiconductor portion 126 is less than the first height H1 of the first semiconductor portion 118, the structural stability of the first semiconductor nanowire 130P is improved. In some embodiments, the first height H1 of the first semiconductor portion 118 is greater than the first width W1.

In some embodiments, the first semiconductor portion 118 has a first aspect ratio, which is the value derived from dividing the first height H1 by the first width W1 of the first semiconductor portion 118. In some embodiments, the second semiconductor portion 126 has a second aspect ratio, which is the value derived from dividing the second height H2 by the second width W2 of the second semiconductor portion 126. In some embodiments, the first aspect ratio of the first semiconductor portion 118 is greater than the second aspect ratio of the second semiconductor portion 126.

In some embodiments, since the first aspect ratio of the first semiconductor portion 118 is greater than the second aspect ratio of the second semiconductor portion 126, the structural stability of the first semiconductor nanowire 130P is improved.

In some embodiments, the first width W1 of the first semiconductor portion 118 is in a range from about 6 nm to about 20 nm, for example from about 10 nm to about 15 nm. In some embodiments, the first height H1 of the first semiconductor portion 118 is in a range from about 50 nm to about 150 nm, for example from about 80 nm to about 100 nm. In some embodiments, the first aspect ratio of the first semiconductor portion 118 is in a range from about 2.5 to about 25, for example from about 5 to about 25.

In some cases, if the first aspect ratio is too great, for example greater than 25, the structural stability would be decreased. However, in some other cases, if the first aspect ratio is too small, for example smaller than 2.5, the first semiconductor portion 118 would occupy too much of the area of the device.

In some embodiments, the second width W2 of the second semiconductor portion 126 is in a range from about 3 nm to about 15 nm, for example from about 6 nm to about 10 nm. In some embodiments, the second height H2 of the second semiconductor portion 126 is in a range from about 3 nm to about 150 nm, for example from about 50 nm to about 100 nm. In some embodiments, the second aspect ratio of the second semiconductor portion 126 is in a range from about 1 to about 10, for example from about 2 to about 5.

In some cases, if the second aspect ratio is too great, for example greater than 10, the structural stability would be decreased. However, in some other cases, if the second aspect ratio is too small, for example smaller than 1, the semiconductor device structure might be negatively affected.

Figure 4A:
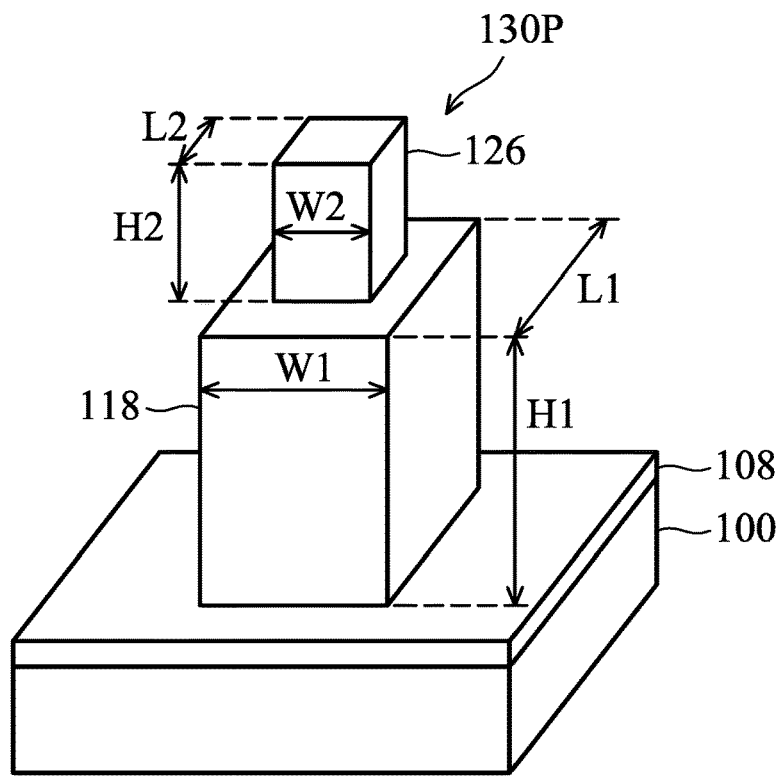
FIG. 4A is a side view of a semiconductor nanowire in accordance with some embodiments of the present disclosure.

In some embodiments, the first semiconductor portion 118 and the second semiconductor portion 126 of the first semiconductor nanowire 130P has a rectangular shape as shown in FIG. 4A. The N-well region and/or the P-well region are not shown in order to clearly describe the embodiments of the present disclosure.

As shown in FIG. 4A, the first semiconductor portion 118 has a first length L1, and the second semiconductor portion 126 has a second length L2, and the second length L2 is shorter than the first length L1, in accordance with some embodiments. In some embodiments, since the second length L2 of the second semiconductor portion 126 is shorter than the first length L1 of the first semiconductor portion 118, the structural stability of the first semiconductor nanowire 130P is improved.

In some embodiments, the first length L1 of the first semiconductor portion 118 is in a range from about 6 nm to about 50 nm, for example from about 20 nm to about 30 nm. In some embodiments, the second length L2 of the second semiconductor portion 126 is in a range from about 3 nm to about 30 nm, for example from about 10 nm to about 20 nm.

In some embodiments, the first length L1 is equal to or greater than the first width W1. In some embodiments, the second length L2 is equal to or greater than the second width W2.

Figure 4B:
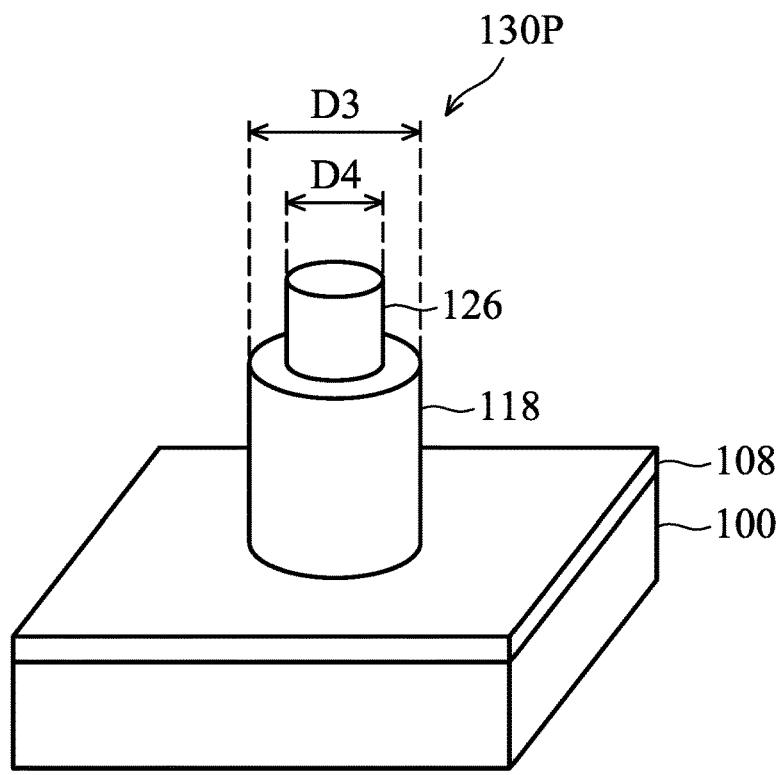
FIG. 4B is a side view of a semiconductor nanowire in accordance with some embodiments of the present disclosure.
Figure 4C:
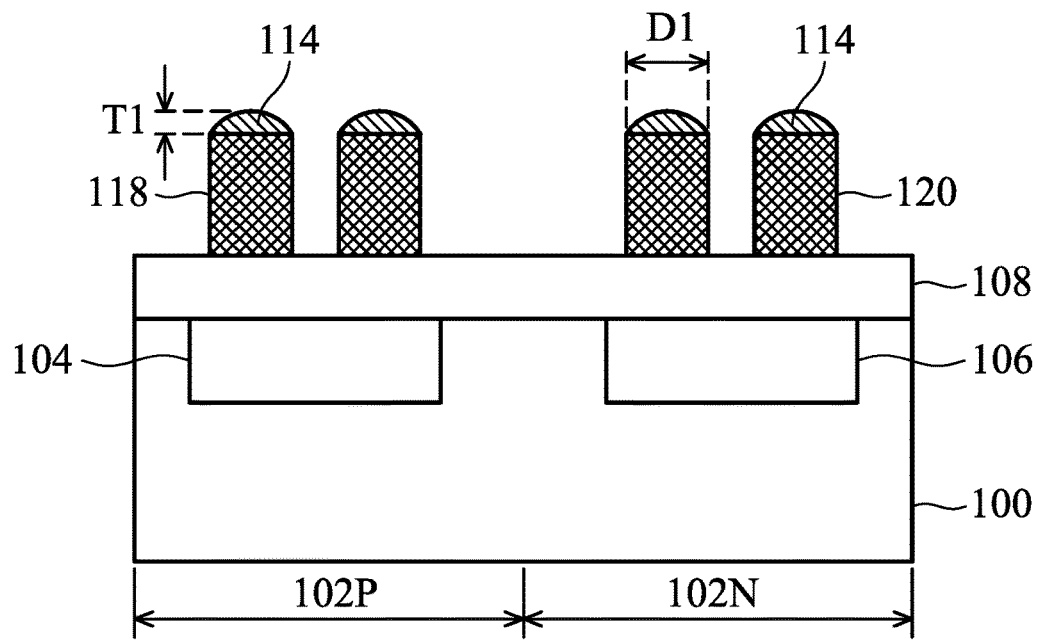
FIGS. 4C-4F are cross-sectional views of various stages of a process for forming a semiconductor device structure, in accordance with some embodiments.
Figure 4D:
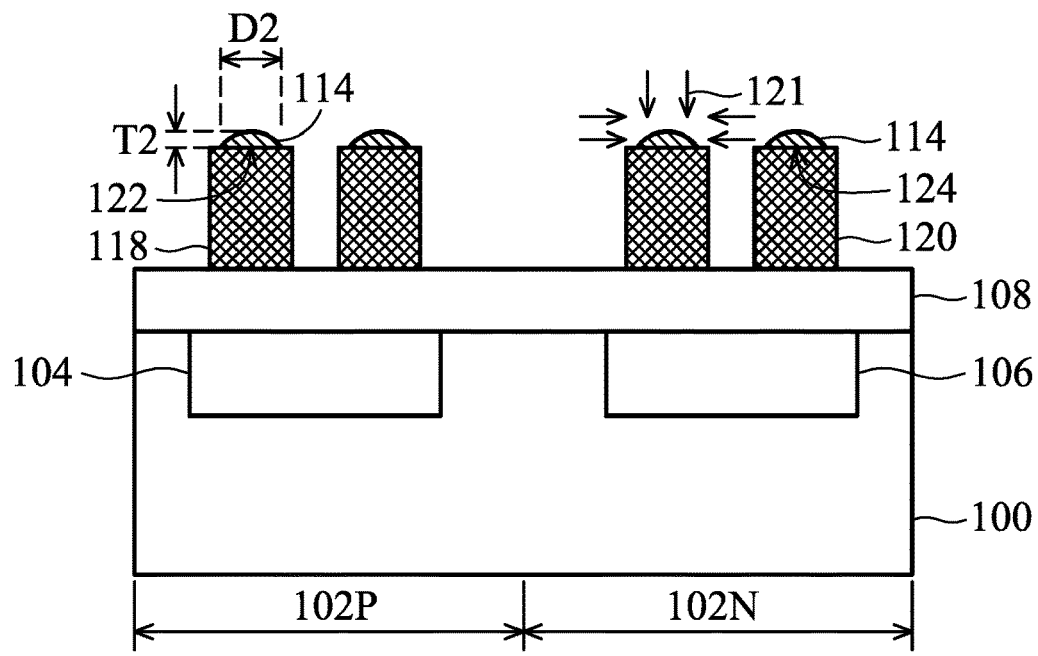
Figure 4E:
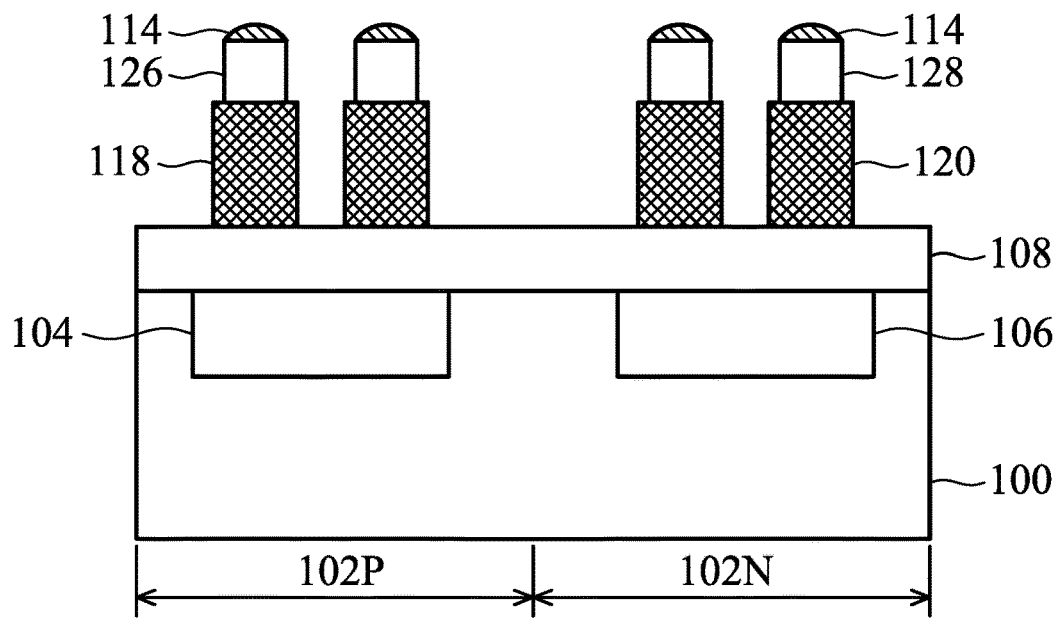
Figure 4F:
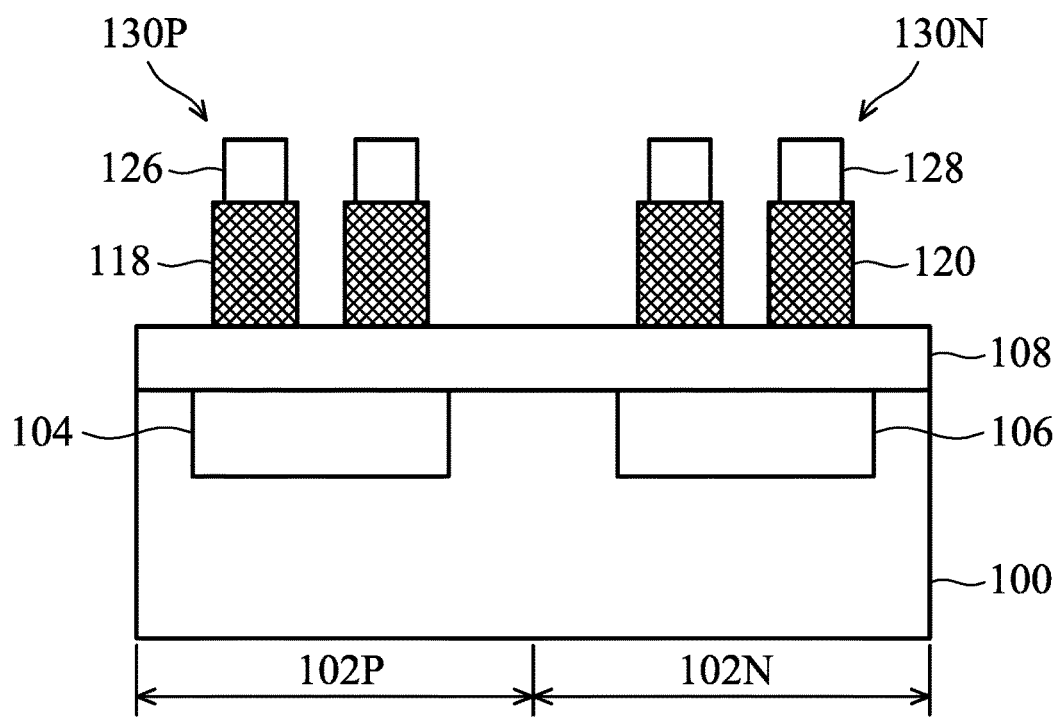

In some other embodiments of the present disclosure, the first semiconductor portion 118 and the second semiconductor portion 126 of the first semiconductor nanowire 130P has a cylindrical shape as shown in FIG. 4B. The N-well region and/or the P-well region are not shown in order to clearly describe the embodiments of the present disclosure. In some embodiments of the present disclosure, when the first semiconductor portion 118 and the second semiconductor portion 126 has the cylindrical shape, the metal portion 114 used to form the cylindrical first semiconductor portion 118 and the cylindrical second semiconductor portion 126 has a semisphere shape as shown in FIG. 4C. In some embodiments of the present disclosure, the cylindrical first semiconductor portion 118 and the cylindrical second semiconductor portion 126 are formed by the process shown in FIGS. 4C-4F with the method similar to or the same as those described in FIG. 1G-1J.

As shown in FIG. 4B, the first semiconductor portion 118 has a first diameter D3, and the second semiconductor portion 126 has a second diameter D4, and the second diameter D4 is less than the first diameter D3, in accordance with some embodiments. In some embodiments, since the second diameter D4 of the second semiconductor portion 126 is less than the first diameter D3 of the first semiconductor portion 118, the structural stability of the first semiconductor nanowire 130P is improved. In some embodiments, the first diameter D3 is the first width W1 of the first semiconductor portion 118 shown in FIG. 1M, and the second diameter D4 is the second width W2 of the second semiconductor portion 126 shown in FIG. 1M.

In some embodiments, the second semiconductor nanowire 130N has a shape that is the same as or similar to the shape of the first semiconductor nanowire 130P. Therefore, the shape of the second semiconductor nanowire 130N will not be repeated for the sake of brevity.

Afterward, referring to FIG. 1N, cap layers 134 are deposited over the first semiconductor nanowire 130P in the PMOS region 102P and over the second semiconductor nanowire 130N in the N-well region 104, in accordance with some embodiments. As shown in FIG. 1N, the cap layers 134 cover the top surfaces and side surfaces of the first semiconductor nanowire 130P and the second semiconductor nanowire 130N, in accordance with some embodiments.

In some embodiments, the cap layer 134 is substantially made of silicon. In some embodiments, the cap layer 134 is deposited using a CVD process, an ALD process, a spin-on process, a spray coating process, another applicable process, or a combination thereof.

In some embodiments, after forming the cap layer 134, a thermal process is performed to the first semiconductor nanowire 130P and the second semiconductor nanowire 130N, in accordance with some embodiments. In some embodiments, the thermal process is an annealing process, such as a rapid thermal annealing process. In some embodiments of the present disclosure, after the thermal process, the cap layer 134 is removed.

Figure 5A:
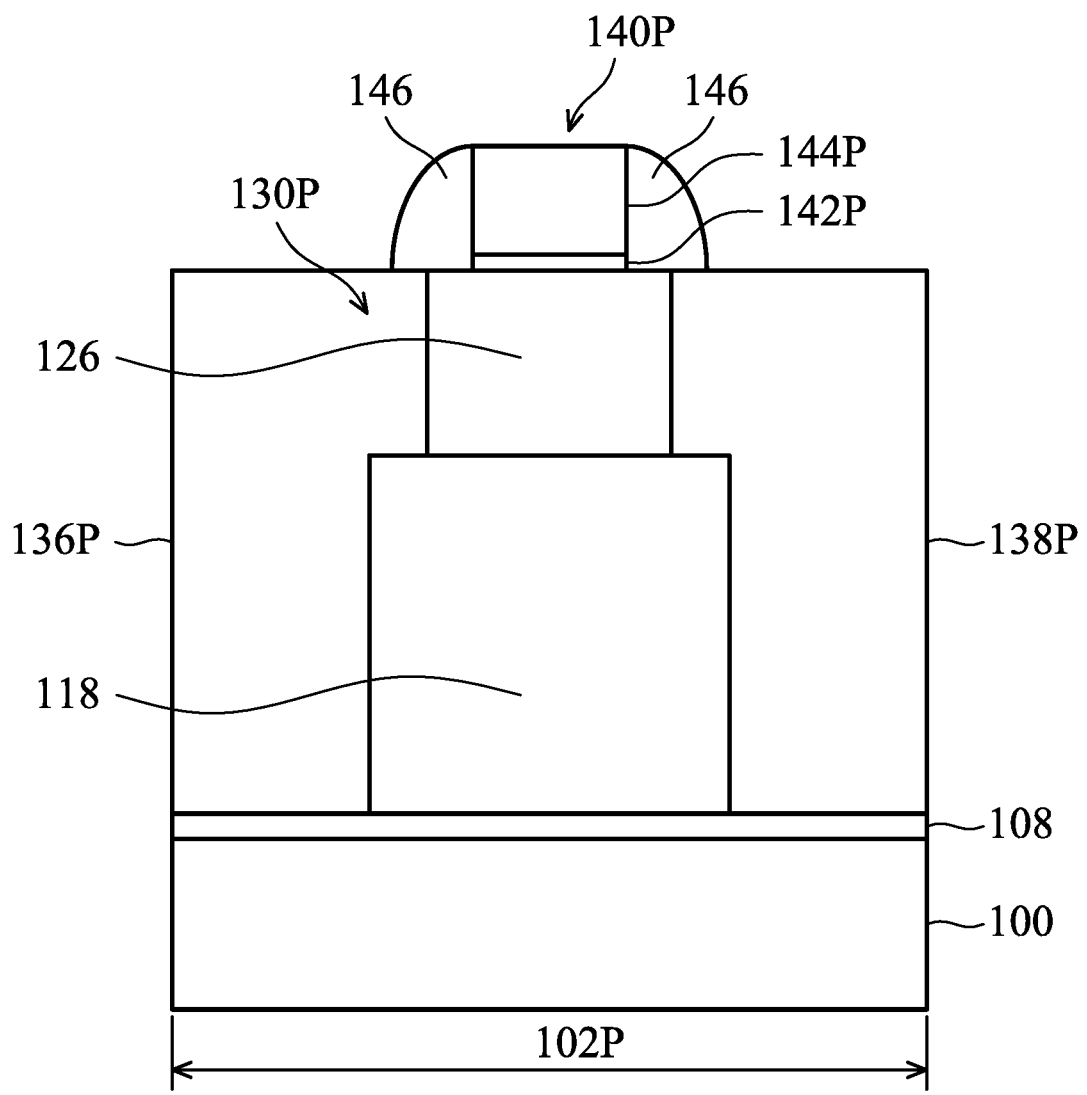
FIG. 5A is a cross-sectional view of a semiconductor device in accordance with some embodiments of the present disclosure.
Figure 5B:
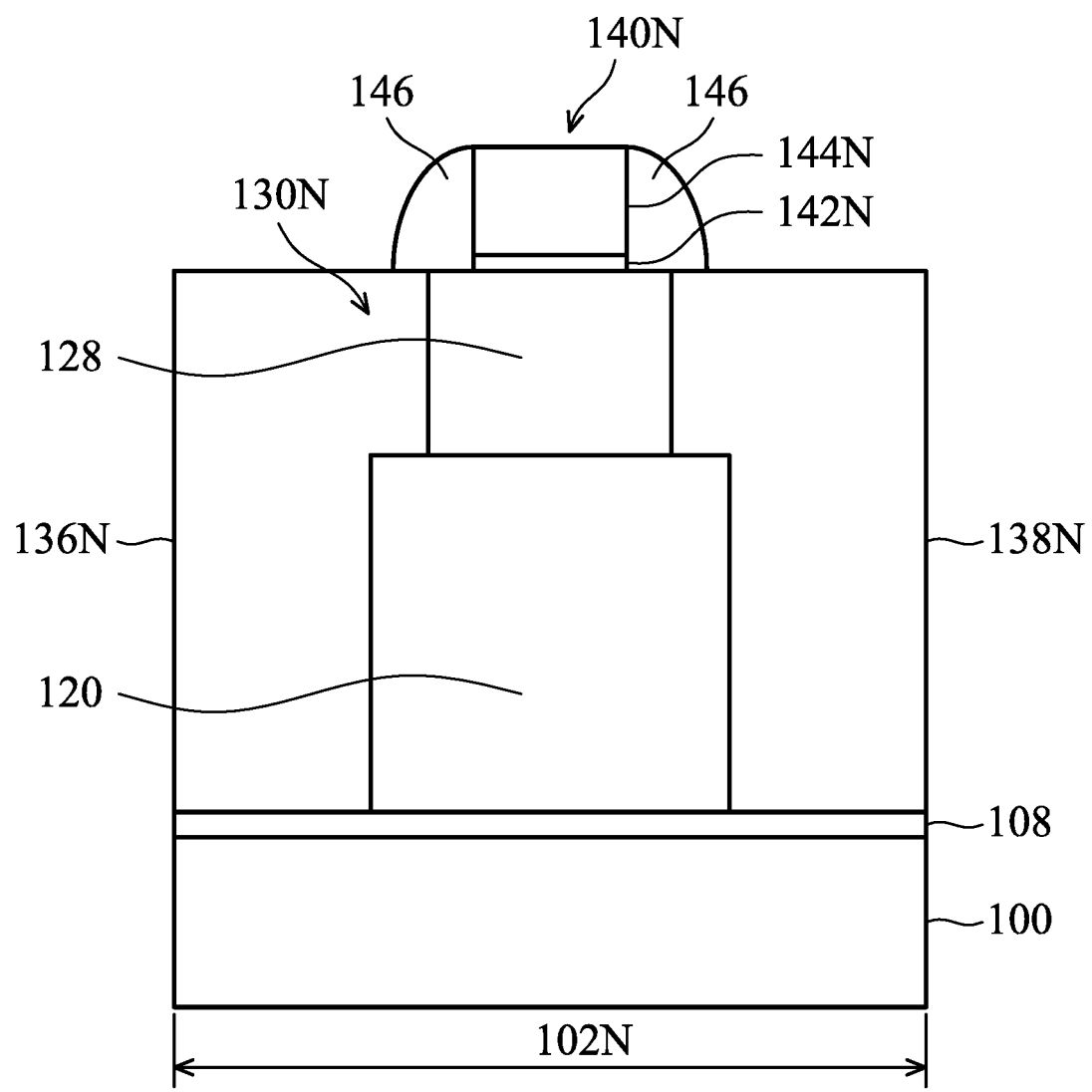
FIG. 5B is a cross-sectional view of a semiconductor device in accordance with some embodiments of the present disclosure.

After the formation of the cap layer 134, the PFET 500A and NFET 500B are formed as shown in FIGS. 5A-5B in accordance with some embodiments. FIG. 5A is a cross-sectional view of a P-type field-effect transistor 500A (PFET 500A) in PFET region 102P in accordance with some embodiments of the present disclosure. FIG. 5B is a cross-sectional view of an N-type field-effect transistor 500B (NFET 500B) in NFET region 102N in accordance with some embodiments of the present disclosure. The N-well region and/or the P-well region are not shown in order to clearly describe the embodiments of the present disclosure.

As shown in FIG. 5A, a source portion 136P and a drain portion 138P are formed at opposite sides of the first semiconductor nanowire 130P, respectively, in accordance with some embodiments. In some embodiments, the source portion 136P and the drain portion 138P are adjacent to the side surfaces of the first semiconductor nanowire 130P. As shown in FIG. 5A, the source portion 136P and the drain portion 138P are positioned over the semiconductor substrate 100, in accordance with some embodiments.

As shown in FIG. 5A, the first semiconductor nanowire 130P is positioned over the semiconductor substrate 100 and between the source portion 136P and the drain portion 138P, in accordance with some embodiments.

In some embodiments, the source portion 136P and the drain portion 138P are made of a p-type semiconductor material. The source portion 136P and the drain portion 138P may include epitaxially grown silicon germanium.

In some embodiments, the source portion 136P and the drain portion 138P are formed by using a selective epitaxial growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, another applicable process, or a combination thereof.

In some embodiments, the source portion 136P and the drain portion 138P are doped with one or more suitable dopants. For example, the source portion 136P and the drain portion 138P are SiGe source/drain features doped with boron (B) or another suitable dopant.

In some embodiments, the source portion 136P and the drain portion 138P are doped in-situ during the growth of the source portion 136P and the drain portion 138P. In some other embodiments, the source portion 136P and the drain portion 138P are not doped during the growth of the source portion 136P and the drain portion 138P. After the formation of the source portion 136P and the drain portion 138P, the source portion 136P and the drain portion 138P are doped in a subsequent process. In some embodiments, the doping is achieved by using an ion implantation process, a plasma immersion ion implantation process, a gas and/or solid source diffusion process, another applicable process, or a combination thereof. In some embodiments, the source portion 136P and the drain portion 138P are further exposed to annealing processes to activate the dopants. For example, a rapid thermal annealing process is performed.

Afterward, a gate structure 140P is formed over the second semiconductor portion 126 of the first semiconductor nanowire 130P in the PFET region 102P. As shown in FIG. 5A, the gate structure 140P includes a gate dielectric layer 142P over the second semiconductor portion 126 of the first semiconductor nanowire 130P in the PFET region 102P and a gate electrode 144P over the gate dielectric layer 142P, in accordance with some embodiments. In some embodiments, a portion of the second semiconductor portion 126 between the source portion 136P and the drain portion 138P and under the gate structure 140P serves as a channel (not shown) of the PFET 500A.

In some embodiments, the gate dielectric layer 142P is made of silicon oxide, silicon nitride, silicon oxynitride, high-k material, another suitable dielectric material, or a combination thereof. In some embodiments, the high-k material may include, but is not limited to, metal oxide, metal nitride, metal silicide, transition metal oxide, transition metal nitride, transition metal silicide, transition metal oxynitride, metal aluminate, zirconium silicate, zirconium aluminate. For example, the material of the high-k material may include, but is not limited to, LaO, AlO, ZrO, TiO, $Ta_2O_5$, $Y_2O_3$, $SrTiO_3$(STO), $BaTiO_3$(BTO), BaZrO, $HfO_2$, $HfO_3$, HfZrO, HfLaO, HfSiO, HfSiON, LaSiO, AlSiO, HfTaO, HfTiO, HfTaTiO, HfAlON, $(Ba,Sr)TiO_3$(BST), $Al_2O_3$, another suitable high-k dielectric material, or a combination thereof.

In some embodiments, the gate electrode 144P is made of polysilicon, a metal material, another suitable conductive material, or a combination thereof. In some embodiments, the metal material may include, but is not limited to, copper, aluminum, tungsten, molybdenum, titanium, tantalum, platinum, or hafnium. In some embodiments, the gate electrode 144P is a dummy gate electrode and will be replaced with another conductive material such as a metal material. The dummy gate electrode layer is made of, for example, polysilicon.

In some embodiments, a gate dielectric material layer (not shown) and a gate electrode material layer (not shown) are sequentially deposited over the second semiconductor portion 126 of the first semiconductor nanowire 130P. In some embodiments, the gate dielectric material layer and the gate electrode material layer are sequentially deposited by using applicable deposition methods. In some embodiments, the applicable deposition methods for depositing the gate dielectric material layer may include a chemical vapor deposition (CVD) process, an atomic layer deposition (ALD) process, a thermal oxidation process, a spin-on coating process, another applicable process, or a combination thereof. In some embodiments, the applicable deposition methods for depositing the gate electrode material layer may include a chemical vapor deposition (CVD), a physical vapor deposition (PVD) process, or another applicable method.

Afterwards, according to some embodiments of the present disclosure, the gate dielectric material layer and the gate electrode material layer are patterned to form the gate structure 140P including the gate dielectric layer 142P and the gate electrode 144P.

As shown in FIG. 5A, spacer elements 146 are formed over sidewalls of the gate structure 140P, in accordance with some embodiments. In some embodiments, the spacer elements 146 are made of silicon nitride, silicon oxynitride, silicon carbide, another suitable material, or a combination thereof.

In some embodiments, a spacer layer is deposited over the gate structure 140P, the source portion 136P and the drain portion 138P. The spacer layer may be deposited using a CVD process, a PVD process, a spin-on coating process, another applicable process, or a combination thereof. Afterwards, an etching process, such as an anisotropic etching process, is performed to partially remove the spacer layer. As a result, the remaining portions of the spacer layer over the sidewalls of the gate structure 140P form the spacer elements 146.

As shown in FIG. 5B, after the formation of the cap layer 134, a source portion 136N and a drain portion 138N are formed at opposite sides of the second semiconductor nanowire 130N, respectively, in accordance with some embodiments. In some embodiments, the source portion 136N and the drain portion 138N are adjacent to the side surfaces of the second semiconductor nanowire 130N.

In some embodiments, the source portion 136N and the drain portion 138N are made of an n-type semiconductor material. The source portion 136N and the drain portion 138N may include epitaxially grown silicon, epitaxially grown silicon phosphide (SiP), or another applicable epitaxially grown semiconductor material. In some embodiments, the source portion 136N and the drain portion 138N are formed by using a selective epitaxial growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, another applicable process, or a combination thereof.

In some embodiments, the source portion 136N and the drain portion 138N are doped with one or more suitable dopants. For example, the source portion 136N and the drain portion 138N are Si source/drain features doped with phosphor (P), antimony (Sb), or another suitable dopant.

In some embodiments, the source portion 136N and the drain portion 138N are doped in-situ during the growth of the source portion 136N and the drain portion 138N. In some other embodiments, the source portion 136N and the drain portion 138N are not doped during the growth of the source portion 136N and the drain portion 138N. After the formation of the source portion 136N and the drain portion 138N, the source portion 136N and the drain portion 138N are doped in a subsequent process. In some embodiments, the doping is achieved by using an ion implantation process, a plasma immersion ion implantation process, a gas and/or solid source diffusion process, another applicable process, or a combination thereof. In some embodiments, the source portion 136N and the drain portion 138N are further exposed to annealing processes to activate the dopants. For example, a rapid thermal annealing process is performed.

Afterward, as shown in FIG. 5B, a gate structure 140N including a gate dielectric layer 142N and the gate electrode 144N is formed over the fourth semiconductor portion 128 of the second semiconductor nanowire 130N in the NFET region 102N, in accordance with some embodiments. As shown in FIG. 5B, spacer elements 146 are formed over sidewalls of the gate structure 140N, in accordance with some embodiments. In some embodiments, a portion of the fourth semiconductor portion 128 between the source portion 136N and the drain portion 138N and under the gate structure 140N serves as a channel (not shown) of the NFET 500B.

In some embodiments, the materials and the formation methods for the gate structure 140N and the spacer elements 146 are the same as or similar to those described in FIG. 5A. Therefore, the materials and the formation methods for the gate structure 140N and the spacer elements 146 will not be repeated for the sake of brevity.

It should be noted that the exemplary embodiment set forth in FIGS. 5A-5B is merely for the purpose of illustration. In addition to the embodiment set forth in FIGS. 5A-5B, the first semiconductor nanowire 130P and the second semiconductor nanowire 130N may have another amount of semiconductor portions than shown in FIGS. 6A-6B. Therefore, the present disclosure is not limited to the exemplary embodiment shown in FIGS. 5A-5B.

Figure 6A:
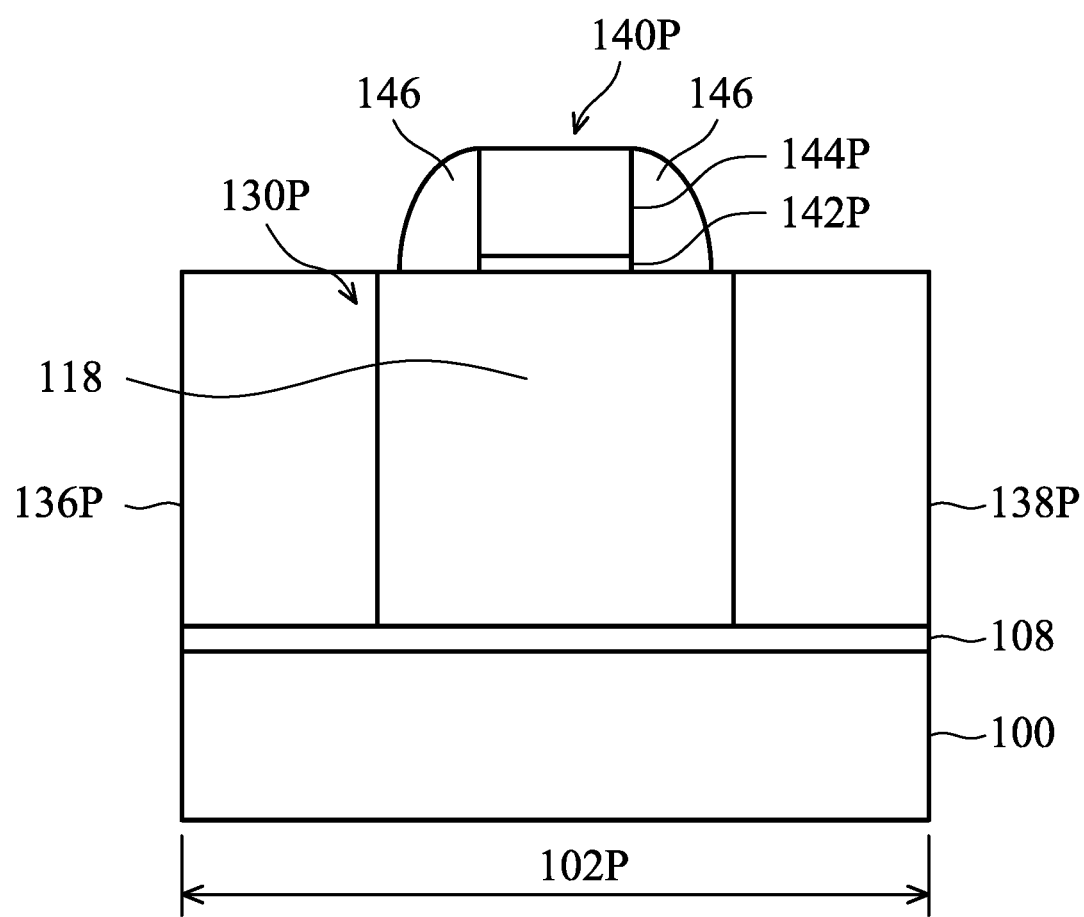
FIG. 6A is a cross-sectional view of a semiconductor device in accordance with some embodiments of the present disclosure.
Figure 6B:
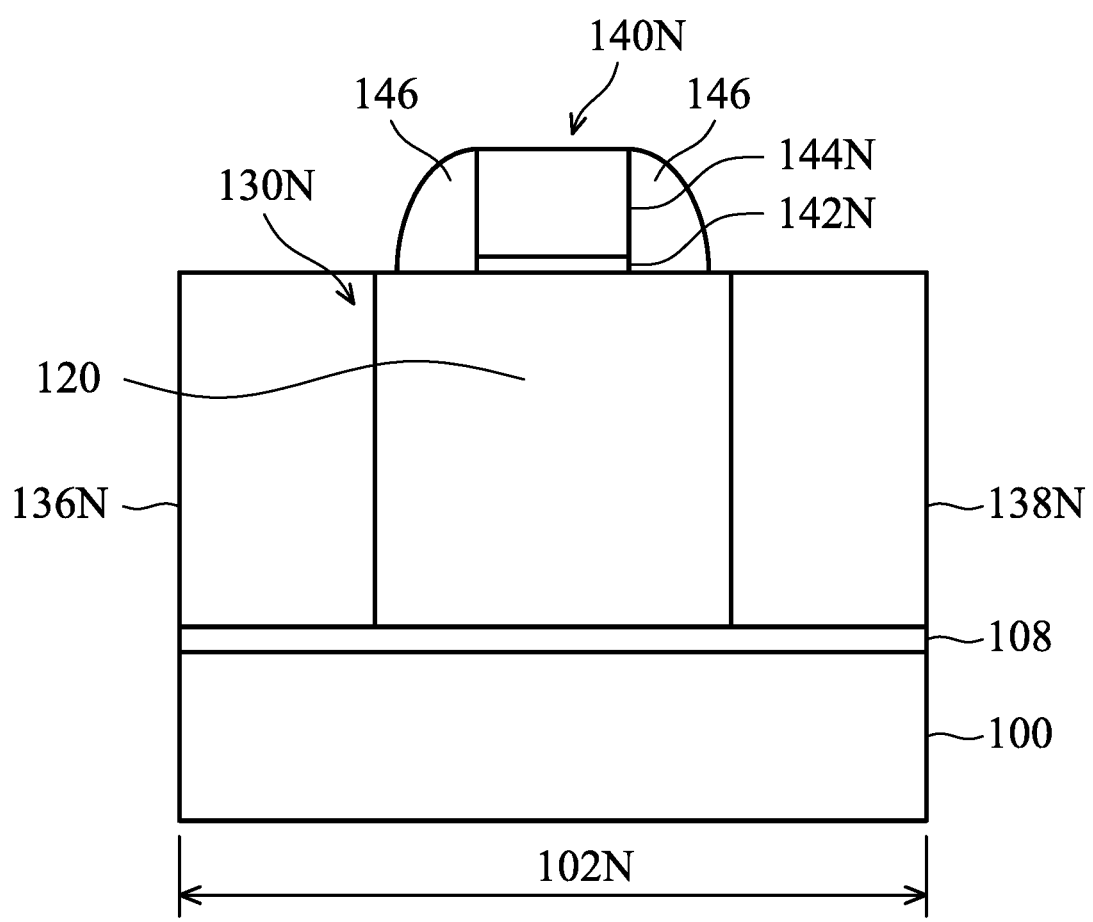
FIG. 6B is a cross-sectional view of a semiconductor device in accordance with some embodiments of the present disclosure.

FIG. 6A is a cross-sectional view of a P-type field-effect transistor 600A (PFET 600A) in PFET region 102P in accordance with some embodiments of the present disclosure. FIG. 6B is a cross-sectional view of an N-type field-effect transistor 600B (NFET 600B) in NFET region 102N in accordance with some embodiments of the present disclosure. The N-well region and/or the P-well region are not shown in order to clearly describe the embodiments of the present disclosure.

As shown in FIG. 6A, the first semiconductor nanowire 130P of the PFET 600A includes one semiconductor portion, namely the first semiconductor portion 118, in accordance with some embodiments. As shown in FIG. 6B, the second semiconductor nanowire 130N of the NFET 600B includes one semiconductor portion, namely the third semiconductor portion 120, in accordance with some embodiments.

However, in some other embodiments of the present disclosure, the semiconductor nanowire includes three or more semiconductor portions. In some embodiments of the present disclosure, for each adjacent pair of semiconductor portions, the upper one has a width that is less than the lower one. In some embodiments of the present disclosure, for each adjacent pair of semiconductor portions, the upper one has a lower aspect ratio than the lower one.

Figure 7A:
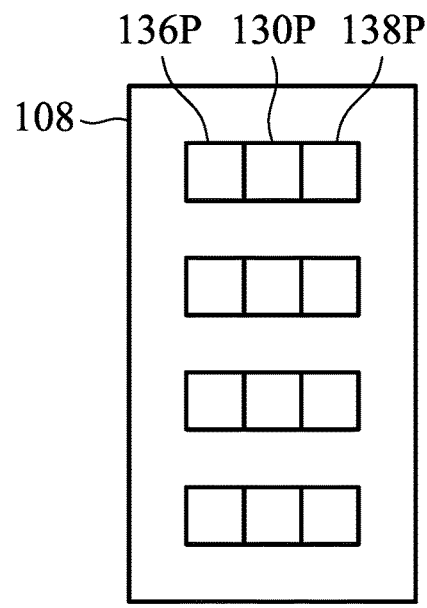
FIG. 7A is a top view of a semiconductor device in accordance with some embodiments of the present disclosure.

FIG. 7A is a top view of a semiconductor device structure 700A in accordance with some embodiments of the present disclosure. In order to clearly describe the embodiments of the present disclosure, FIG. 7A merely shows the semiconductor material layer 108, the first semiconductor nanowire 130P, the source portion 136P and the drain portion 138P. As shown in FIG. 7A, one first semiconductor nanowire 130P is positioned between one source portion 136P and one drain portion 138P, in accordance with some embodiments.

Figure 7B:
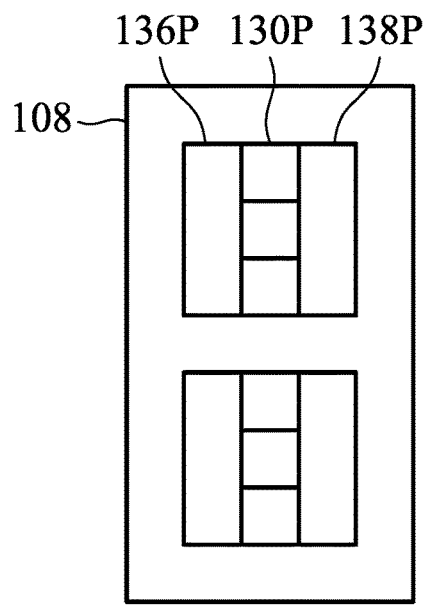
FIG. 7B is a top view of a semiconductor device in accordance with some embodiments of the present disclosure.

FIG. 7B is a top view of a semiconductor device structure 700B in accordance with some embodiments of the present disclosure. In order to clearly describe the embodiments of the present disclosure, FIG. 7B merely shows the semiconductor material layer 108, the first semiconductor nanowire 130P, the source portion 136P and the drain portion 138P. As shown in FIG. 7B, the semiconductor device structure 700B includes a plurality of first semiconductor nanowires 130P, and the plurality of first semiconductor nanowires 130P are between one source portion 136P and one drain portion 138P, in accordance with some embodiments. For example, two of the first semiconductor nanowires 130P are between one source portion 136P and one drain portion 138P.

Figure 7C:
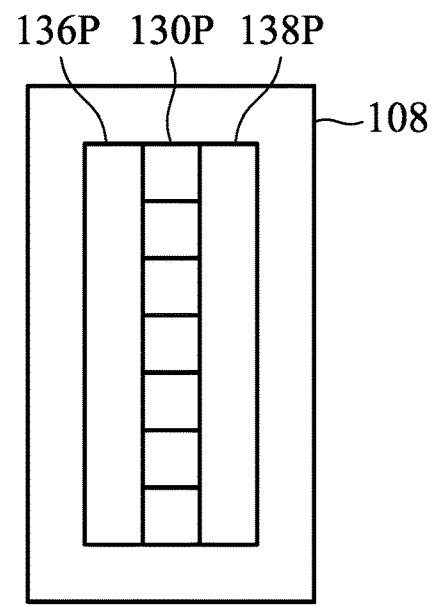
FIG. 7C is a top view of a semiconductor device in accordance with some embodiments of the present disclosure.

FIG. 7C is a top view of a semiconductor device structure 700C in accordance with some embodiments of the present disclosure. In order to clearly describe the embodiments of the present disclosure, FIG. 7C merely shows the semiconductor material layer 108, the first semiconductor nanowire 130P, the source portion 136P and the drain portion 138P. As shown in FIG. 7C, the semiconductor device structure 700C includes a plurality of first semiconductor nanowires 130P, and the plurality of first semiconductor nanowires 130P are between one source portion 136P and one drain portion 138P, in accordance with some embodiments. For example, four of the first semiconductor nanowires 130P are between one source portion 136P and one drain portion 138P.

In some embodiments, the configuration of the second semiconductor nanowires 130N, the source portion 136N and the drain portion 138N are the same as or similar to the configuration of the first semiconductor nanowires 130P, the source portion 136P and the drain portion 138P. Therefore, the configuration of the second semiconductor nanowires 130N, the source portion 136N and the drain portion 138N will not be repeated for the sake of brevity.

In some other embodiments, the source portion 136P and the drain portion 138P are formed at other position by other methods as shown in FIGS. 8A-8B and 9A-9B. Therefore, the present disclosure is not limited to the exemplary embodiment shown in FIGS. 5A-6B.

Figure 8A:
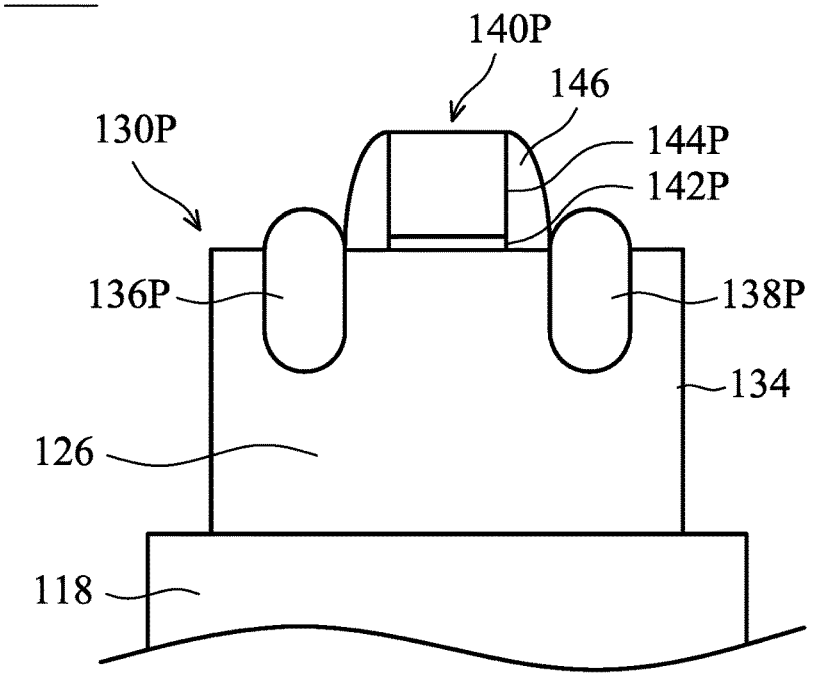
FIG. 8A is a cross-sectional view of a semiconductor device in accordance with some embodiments of the present disclosure.

FIG. 8A is a cross-sectional view of a PFET 800A in accordance with some embodiments of the present disclosure. As shown in FIG. 8A, the source portion 136P and the drain portion 138P are respectively formed over the second semiconductor portion 126, in accordance with some embodiments. As shown in FIG. 8A, the source portion 136P and the drain portion 138P are formed in two recesses in the second semiconductor portion 126, in accordance with some embodiments. As shown in FIG. 8A, the source portion 136P and the drain portion 138P are at opposite sides of the gate structure 140P and adjacent to the gate structure 140P.

In some embodiments, the source portion 136P and the drain portion 138P are made of a p-type semiconductor material. The source portion 136P and the drain portion 138P may include epitaxially grown silicon germanium.

In some embodiments, a portion of the second semiconductor portion 126 is removed to form two recesses in the second semiconductor portion 126, in accordance with some embodiments. In some embodiments, the two recesses are at opposite sides of the gate structure 140P and adjacent to the gate structure 140P. In some embodiments, a photolithography process and an etching process are performed to form the two recesses. In some embodiments, a semiconductor material is epitaxially grown in the two recesses and continues to grow to above the two recesses to form the source portion 136P and the drain portion 138P.

The source portion 136P and the drain portion 138P may alternatively be referred to as raised source and drain features. In some embodiments, the source portion 136P and the drain portion 138P are strained structures. The source portion 136P and the drain portion 138P impart stress or strain to the channel under the gate structure 140P to enhance the carrier mobility of the device and improve device performance.

Figure 8B:
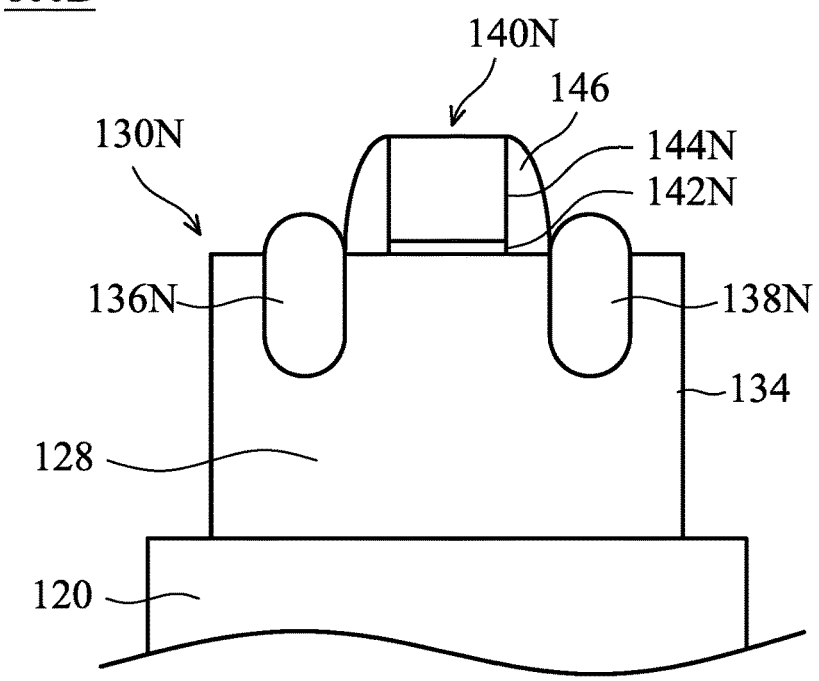
FIG. 8B is a cross-sectional view of a semiconductor device in accordance with some embodiments of the present disclosure.

FIG. 8B is a cross-sectional view of an NFET 800B in accordance with some embodiments of the present disclosure. As shown in FIG. 8B, the source portion 136N and the drain portion 138N are respectively formed over the fourth semiconductor portion 128, in accordance with some embodiments. As shown in FIG. 8B, the source portion 136N and the drain portion 138N are formed in two recesses in the fourth semiconductor portion 128, in accordance with some embodiments. As shown in FIG. 8B, the source portion 136N and the drain portion 138N are at opposite sides of the gate structure 140N and adjacent to the gate structure 140N.

In some embodiments, the source portion 136N and the drain portion 138N are made of an n-type semiconductor material. The source portion 136N and the drain portion 138N may include epitaxially grown silicon, epitaxially grown silicon phosphide (SiP), or another applicable epitaxially grown semiconductor material. In some embodiments, the source portion 136N and the drain portion 138N are formed by using a selective epitaxial growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, another applicable process, or a combination thereof.

Figure 9A:
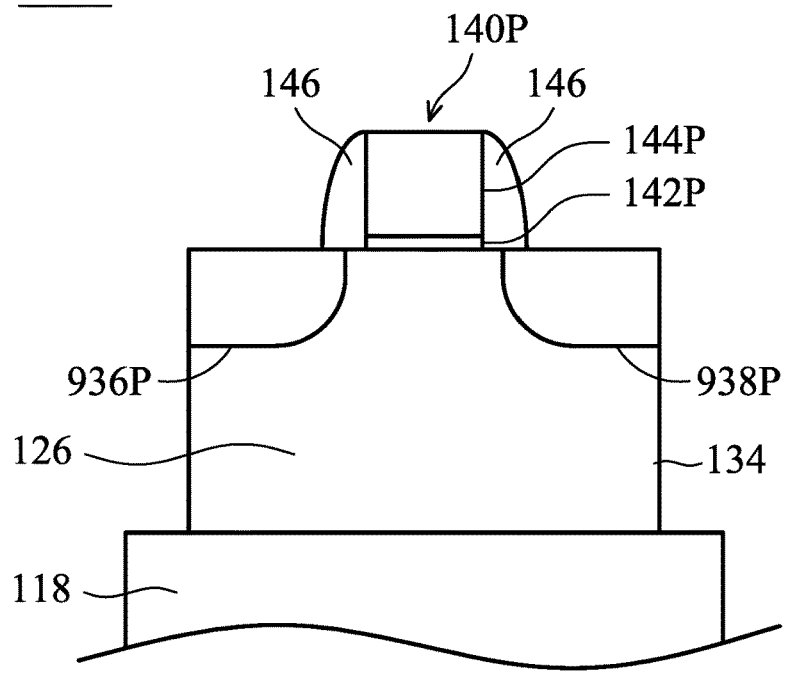
FIG. 9A is a cross-sectional view of a semiconductor device in accordance with some embodiments of the present disclosure.

FIG. 9A is a cross-sectional view of a PFET 900A in accordance with some embodiments of the present disclosure. As shown in FIG. 9A, the source portion 936P and the drain portion 938P are formed in the second semiconductor portion 126, in accordance with some embodiments. In some embodiments, an implantation mask layer (not shown) is used to cover the NMOS region 102N. Afterwards, an implantation process is performed, also with the gate structure 140P as an implantation mask, to form the source portion 936P and the drain portion 938P. In some embodiments, P-type dopants such as boron or $BF_2$ are implanted into the second semiconductor portion 126 to form the source portion 936P and the drain portion 938P, without being implanted into the NMOS region 102N. After the source portion 936P and the drain portion 938P are formed, the implantation mask layer is removed.

The source portion 936P and the drain portion 938P are adjacent to the gate structure 140P and are respectively on opposite sides of the gate structure 140P and in the second semiconductor portion 126. In some embodiments, a portion of the source portion 936P and the drain portion 938P is near the gate structure 140P and underneath the spacer elements 146. In some embodiments, the implantation processes are performed at an angle such that the formed the source portion 936P and the drain portion 938P extend under the gate structure 140P. In some embodiments, the source portion 936P and the drain portion 938P are also formed in the cap layer 134.

Embodiments of the disclosure have many variations. In some embodiments, the source portion 936P and the drain portion 938P are not covered by the spacer elements 146. In some other embodiments, the source portion 936P and the drain portion 938P further extend under the gate structure 140P and are covered by the gate structure 140P.

Figure 9B:
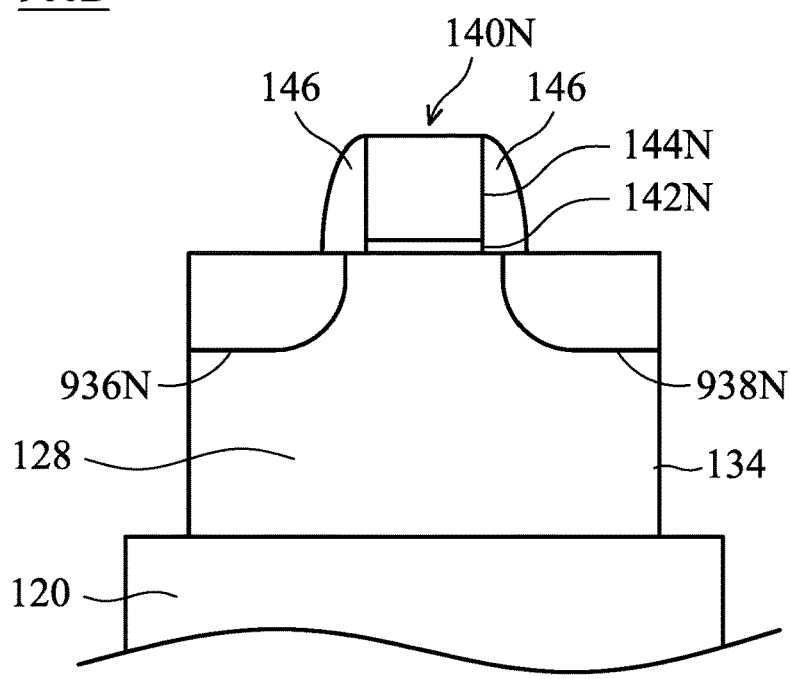
FIG. 9B is a cross-sectional view of a semiconductor device in accordance with some embodiments of the present disclosure.

FIG. 9B is a cross-sectional view of an NFET 900B in accordance with some embodiments of the present disclosure. As shown in FIG. 9B, the source portion 936N and the drain portion 938N are formed in the fourth semiconductor portion 128, as shown in FIG. 9B in accordance with some embodiments. In some embodiments, an implantation mask layer (not shown) is used to cover the PMOS region 102P. Afterwards, an implantation process is performed, also with the gate structure 140N as an implantation mask, to form the source portion 936N and the drain portion 938N. In some embodiments, N-type dopants such as phosphor or arsenic are implanted into the fourth semiconductor portion 128 to form the source portion 936N and the drain portion 938N, without being implanted into the PMOS region 102P. After the source portion 936N and the drain portion 938N are formed, the implantation mask layer is removed.

In some embodiments, the source portion 936N and the drain portion 938N are adjacent to the gate structure 140N and are respectively on opposite sides of the gate structure 140N and in the fourth semiconductor portion 128. In some embodiments, a portion of the source portion 936N and the drain portion 938N is near the gate structure 140N and underneath the spacer elements 146. In some embodiments, the implantation processes are performed at an angle such that the formed the source portion 936N and the drain portion 938N extend under the gate structure 140N. In some embodiments, the source portion 936N and the drain portion 938N are also formed in the cap layer 134. In some other embodiments, the source portion 936N and the drain portion 938N is formed before the source portion 936P and the drain portion 938P.

Embodiments of the disclosure have many variations. In some embodiments, the source portion 936N and the drain portion 938N are not covered by the spacer elements 146. In some other embodiments, the source portion 936N and the drain portion 938N further extend under the gate structure 140N and are covered by the gate structure 140N.

Afterwards, an annealing process, such as a rapid thermal process (RTP), may be performed to repair the crystal structure of the silicon in the source portion 936P, the drain portion 938P, the source portion 936N and the drain portion 938N and activate the dopant in the source portion 936P, the drain portion 938P, the source portion 936N and the drain portion 938N.

Embodiments of the disclosure use the vapor-solid-solid method and/or the vapor-liquid-solid method to grow the semiconductor nanowire or the semiconductor portion. Therefore, the grown semiconductor nanowire or semiconductor portion, which serves as the fin structure, is a single crystal and is defect-free. Thereby, the quality of the semiconductor device structure may be improved.

In some embodiments, since the width of the upper portion (such as the second width of the second semiconductor portion) in the semiconductor nanowire is less than the width of the bottom portion (such as the first width of the first semiconductor portion), the structural stability of the first semiconductor nanowire is improved.

In accordance with some embodiments, a semiconductor device structure is provided. The semiconductor device structure includes a substrate, a first source portion and a first drain portion over the substrate, and a first semiconductor nanowire over the substrate and between the first source portion and the first drain portion. The first semiconductor nanowire includes a first portion over the substrate and a second portion over the first portion, and the first portion has a first width, and the second portion has a second width, and the second width is less than the first width. The semiconductor device structure also includes a first gate structure over the second portion of the first semiconductor nanowire.

In accordance with some embodiments, a method for forming a semiconductor device structure is provided. The method includes forming a semiconductor layer over a substrate, and forming a metal portion over the semiconductor layer. The metal portion includes at least one metal. The method also includes growing a semiconductor nanowire from an interface of the metal portion and the semiconductor layer. The growth of the semiconductor nanowire separates the metal portion apart from the semiconductor layer. After the growth of the semiconductor nanowire, the metal portion is over the semiconductor nanowire. The method also includes removing the metal portion, forming a source portion and a drain portion at opposite sides of the semiconductor nanowire respectively, and forming a gate structure over the semiconductor nanowire.

In accordance with some embodiments, a method for forming a semiconductor device structure is provided. The method includes forming a semiconductor layer over a substrate, and forming a metal portion over the semiconductor layer. The metal portion includes at least one metal and has a first length. The method also includes growing a first semiconductor portion from an interface of the metal portion and the semiconductor layer. The growth of the first semiconductor portion separates the metal portion apart from the semiconductor layer. After the growth of the semiconductor nanowire, the metal portion is over the first semiconductor portion. The method also includes partially etching the metal portion. The etched metal portion has a second length that is shorter than the first length. The method also includes growing a second semiconductor portion from an interface of the etched metal portion and the first semiconductor portion. The growth of the second semiconductor portion separates the etched metal portion apart from the first semiconductor portion. After the growth of the second semiconductor portion, the etched metal portion is over the second semiconductor portion, and the first semiconductor portion and the second semiconductor portion form a semiconductor nanowire. The method also includes removing the etched metal portion, forming a source portion and a drain portion at opposite sides of the semiconductor nanowire, respectively, and forming a gate structure over the second semiconductor portion of the semiconductor nanowire.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a substrate;
   a first source portion and a first drain portion over the substrate;
   a first semiconductor nanowire over the substrate and between the first source portion and the first drain portion, wherein the first semiconductor nanowire comprises a first portion over the substrate and a second portion over the first portion, wherein the first portion has a first width, and the second portion has a second width, wherein the second width is less than the first width; and
   a first gate structure over the second portion of the first semiconductor nanowire, wherein the first semiconductor nanowire has a first lattice distance, the substrate has a second lattice distance, and the first lattice distance of the first semiconductor nanowire is greater than the second lattice distance of the substrate.

2. The semiconductor device structure as claimed in claim 1, wherein the first portion has a first aspect ratio, and the second portion has a second aspect ratio, wherein the first aspect ratio is greater than the second aspect ratio.

3. The semiconductor device structure as claimed in claim 1, wherein the first portion has a greater height than the first width.

4. The semiconductor device structure as claimed in claim 1, wherein the first semiconductor nanowire is made of silicon, silicon germanium or silicon carbide.

5. The semiconductor device structure as claimed in claim 1, wherein a material of the first portion is different from a material of the second portion.

6. The semiconductor device structure as claimed in claim 1, wherein one first semiconductor nanowire is between one first source portion and one first drain portion.

7. The semiconductor device structure as claimed in claim 1, wherein the semiconductor device structure comprises a plurality of the first semiconductor nanowires, and the plurality of the first semiconductor nanowires are between one first source portion and one first drain portion.

8. The semiconductor device structure as claimed in claim 1, further comprising:
   a cap layer covering the first semiconductor nanowire.

9. The semiconductor device structure as claimed in claim 1, wherein the substrate comprises a first conductive type field-effect transistor region and a second conductive type field-effect transistor region, wherein the first semiconductor nanowire, the first source portion, the first drain portion and the first gate structure are over the first conductive type field-effect transistor region,
   wherein the semiconductor device structure further comprises:
      a second source portion and a second drain portion over the second conductive type field-effect transistor region of the substrate;
      a second semiconductor nanowire over the second conductive type field-effect transistor region of the substrate and between the second source portion and the second drain portion, wherein the second semiconductor nanowire comprises a third portion over the substrate and a fourth portion over the third portion, wherein the third portion has a third width, and the fourth portion has a fourth width, wherein the fourth width is less than the third width; and
      a second gate structure over the fourth portion of the second semiconductor nanowire.

10. The semiconductor device structure as claimed in claim 9, wherein distance the second semiconductor nanowire has a third lattice distance, and the third lattice distance of the second semiconductor nanowire is shorter than or equal to the second lattice distance.

11. A semiconductor device structure, comprising:
    a substrate;
    a first source portion and a first drain portion over the substrate;
    a first semiconductor nanowire over the substrate and between the first source portion and the first drain portion, wherein the first semiconductor nanowire comprises a first portion over the substrate and a second portion over the first portion, wherein the first portion and the second portion are single crystal, and a material of the first portion is different from a material of the second portion; and
    a first gate structure over the second portion of the first semiconductor nanowire.

12. The semiconductor device structure as claimed in claim 11, wherein the first portion has a first aspect ratio, and the second portion has a second aspect ratio, wherein the first aspect ratio is greater than the second aspect ratio.

13. The semiconductor device structure as claimed in claim 11, wherein the first portion has a greater height than the first width.

14. The semiconductor device structure as claimed in claim 11, wherein the first semiconductor nanowire is made of silicon, silicon germanium or silicon carbide.

15. A semiconductor device structure, comprising:
    a substrate;
    a semiconductor layer over the substrate;
    a first source portion and a first drain portion over the semiconductor layer;
    a first semiconductor nanowire over the semiconductor layer and between the first source portion and the first drain portion, wherein the first semiconductor nanowire comprises a first portion over the substrate and a second portion over the first portion, wherein the first portion has a first top surface with a first area, and the second portion has a second top surface with a second area, wherein the first area is greater than the second area; and
    a first gate structure over the second portion of the first semiconductor nanowire, wherein the first semiconductor nanowire has a lattice distance which is shorter than or equal to a lattice distance of the semiconductor layer.

16. The semiconductor device structure as claimed in claim 15, wherein the first portion has a first aspect ratio, and the second portion has a second aspect ratio, wherein the first aspect ratio is greater than the second aspect ratio.

17. The semiconductor device structure as claimed in claim 15, wherein the first portion has a greater height than the first width.

18. The semiconductor device structure as claimed in claim 15, wherein the first semiconductor nanowire is made of silicon, silicon germanium or silicon carbide.

19. The semiconductor device structure as claimed in claim 15, wherein a material of the first portion is different from a material of the second portion.

20. The semiconductor device structure as claimed in claim 11, wherein the first portion has a first height, and the second portion has a second height, wherein the second height is less than the first height.

* * * * *